(12) United States Patent
Lu et al.

(10) Patent No.: US 12,256,488 B2
(45) Date of Patent: Mar. 18, 2025

(54) CIRCUIT BOARD STRUCTURE

(71) Applicant: Unimicron Technology Corp., Taoyuan (TW)

(72) Inventors: Chih-Chiang Lu, New Taipei (TW); Jun-Rui Huang, Tainan (TW); Ming-Hao Wu, Taoyuan (TW); Tung-Chang Lin, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 308 days.

(21) Appl. No.: 18/162,713

(22) Filed: Feb. 1, 2023

(65) Prior Publication Data

US 2023/0262880 A1 Aug. 17, 2023

Related U.S. Application Data

(63) Continuation-in-part of application No. 17/938,977, filed on Sep. 7, 2022, now Pat. No. 12,144,113.
(Continued)

(30) Foreign Application Priority Data

Aug. 5, 2022 (TW) .................................. 111129443
Dec. 26, 2022 (TW) .................................. 111149871

(51) Int. Cl.
*H05K 1/02* (2006.01)
*H05K 1/11* (2006.01)

(52) U.S. Cl.
CPC ............. *H05K 1/025* (2013.01); *H05K 1/112* (2013.01); *H05K 1/0216* (2013.01); *H05K 2201/095* (2013.01)

(58) Field of Classification Search
None
See application file for complete search history.

(56) References Cited

U.S. PATENT DOCUMENTS

2005/0161255 A1 7/2005 Takada
2007/0153488 A1* 7/2007 Yang .................... H05K 3/4661
361/748

(Continued)

FOREIGN PATENT DOCUMENTS

TW 525414 3/2003
TW 200843579 11/2008
(Continued)

OTHER PUBLICATIONS

"Office Action of Taiwan Counterpart Application", issued on Sep. 19, 2023, p. 1-p. 14.

*Primary Examiner* — Timothy J Thompson
*Assistant Examiner* — John B Freal
(74) *Attorney, Agent, or Firm* — JCIPRNET

(57) ABSTRACT

Provided is a circuit board structure including a substrate, a loop-wrapping ground layer, an insulating structure, a first build-up layer, a top wiring layer, a bottom wiring layer, a first conductive via, and a plurality of second conductive vias. The aforementioned structure defines a signal transmitting structure. An equivalent circuit of the signal transmitting structure at least includes a first equivalent circuit, a second equivalent circuit, a third equivalent circuit and a fourth equivalent circuit, which correspond to different uniform transmitting sections respectively. The first equivalent circuit, the second equivalent circuit, the third equivalent circuit and the fourth equivalent circuit are connected in series with each other according to an ABCD transmission matrix series connection principle.

17 Claims, 14 Drawing Sheets

Related U.S. Application Data

(60) Provisional application No. 63/359,213, filed on Jul. 8, 2022, provisional application No. 63/344,634, filed on May 23, 2022, provisional application No. 63/310,103, filed on Feb. 15, 2022.

(56) References Cited

U.S. PATENT DOCUMENTS

| | | | |
|---|---|---|---|
| 2012/0314377 A1* | 12/2012 | Lai | H01L 23/50 |
| | | | 156/292 |
| 2013/0098669 A1* | 4/2013 | Yoshimura | H05K 3/427 |
| | | | 174/258 |
| 2023/0063808 A1* | 3/2023 | Shahidi | H05K 3/0094 |

FOREIGN PATENT DOCUMENTS

| | | |
|---|---|---|
| TW | 200843604 | 11/2008 |
| TW | 201103393 | 1/2011 |
| TW | I335785 | 1/2011 |
| TW | I619302 | 3/2018 |
| TW | I679744 | 12/2019 |

\* cited by examiner

CIRCUIT BOARD STRUCTURE

CROSS-REFERENCE TO RELATED APPLICATION

This application is a continuation-in-part application of and claims the priority benefits of U.S. application Ser. No. 17/938,977, filed on Sep. 7, 2022, which claims the priority benefits of U.S. provisional application Ser. No. 63/310,103, filed on Feb. 15, 2022, U.S. provisional application Ser. No. 63/344,634, filed on May 23, 2022, and U.S. provisional application Ser. No. 63/359,213, filed on Jul. 8, 2022. The prior U.S. application Ser. No. 17/938,977 also claims the priority benefit of Taiwan application serial no. 111129443, filed on Aug. 5, 2022. This application also claims the priority benefit of Taiwan application serial no. 111149871, filed on Dec. 26, 2022. The entirety of each of the above-mentioned patent applications is hereby incorporated by reference herein.

BACKGROUND

Technical Field

The present disclosure relates to a substrate structure, and particularly relates to a circuit board structure.

Description of Related Art

In a conventional circuit board, the design of coaxial vias requires one or more insulating layers between an inner conductive layer and an outer conductive layer for insulation. The one or more insulating layers is formed by lamination and layer build-up. Therefore, impedance mismatch may be present at two ends of the coaxial vias and an electromagnetic interference (EMI) shielding gap may occur, influencing integrity of high-frequency signals. In addition, in the coaxial through-hole design, two ends of the signal path and two ends of the ground path are respectively located at different planes, and noise interference cannot be reduced.

SUMMARY

The disclosure provides a circuit board structure, which can effectively transmit high-frequency and high-speed signals, reduce noise interference, and exhibit better signal integrity.

The circuit board structure of the present disclosure includes a substrate, a loop-wrapping ground layer, an insulating structure, a first build-up structure, a top wiring layer, a bottom wiring layer, a first conductive via, and a plurality of second conductive vias. The substrate has a first surface and a second surface opposite the first surface, wherein the substrate includes an opening penetrating through the substrate. The loop-wrapping ground layer is disposed on an inner sidewall of the opening of the substrate. The insulating structure is disposed in the opening of the substrate. The first build-up structure is disposed on the first surface of the substrate. The top wiring layer is disposed on the first build-up structure, wherein the top wiring layer includes a first top wiring layer and a second top wiring layer. The bottom wiring layer is disposed on the second surface of the substrate, wherein the bottom wiring layer includes a first bottom wiring layer and a second bottom wiring layer. The first conductive via penetrates through the first build-up structure and the insulating structure, and is electrically connected to the first top wiring layer and the first bottom wiring layer, wherein the insulating structure is located between the loop-wrapping ground layer and the first conductive via. The second conductive vias penetrate through the substrate and the first build-up structure, surround the first conductive via, and are electrically connected to the second top wiring layer and the second bottom wiring layer, wherein the loop-wrapping ground layer is located between the first conductive via and the second conductive vias, and is electrically connected to the second conductive vias. The first bottom wiring layer, the first conductive via, the first top wiring layer, the second bottom wiring layer, the loop-wrapping ground layer, a part of the second conductive vias, the second top wiring layer, the insulating structure, and a part of the first build-up structure located between the first conductive via and the second conductive vias define a signal transmitting structure. An equivalent circuit of the signal transmitting structure at least includes a first equivalent circuit, a second equivalent circuit, a third equivalent circuit and a fourth equivalent circuit. The first equivalent circuit corresponds to the first bottom wiring layer and the second bottom wiring layer corresponding to the first bottom wiring layer. The second equivalent circuit corresponds to the loop-wrapping ground layer, the insulating structure, and a part of the first conductive via corresponding to the loop-wrapping ground layer. The third equivalent circuit corresponds to a part of the first build-up structure located between the first conductive via and the second conductive vias, and a part of the first conductive via and a part of the second conductive vias located in the first build-up structure. The fourth equivalent circuit corresponds to the first top wiring layer and the second top wiring layer corresponding to the first top wiring layer. The first equivalent circuit, the second equivalent circuit, the third equivalent circuit and the fourth equivalent circuit respectively correspond to different uniform transmitting sections, and the first equivalent circuit, the second equivalent circuit, the third equivalent circuit and the fourth equivalent circuit are connected in series according to an ABCD transmission matrix series connection principle.

In an embodiment of the present disclosure, an end of the equivalent circuit of the signal transmitting structure is connected to a receiver or a transmitter, and another end of the equivalent circuit of the signal transmitting structure is connected to an antenna.

In an embodiment of the present disclosure, a unit length parameter of the first equivalent circuit, a unit length parameter of the second equivalent circuit, a unit length parameter of the third equivalent circuit, and a unit length parameter of the fourth equivalent circuit are different from each other.

In an embodiment of the present disclosure, the unit length parameter includes resistance, conductance, inductance or capacitance.

In an embodiment of the present disclosure, the first bottom wiring layer, the first conductive via and the first top wiring layer define a signal transmitting path, the second top wiring layer, the second conductive vias, the loop-wrapping ground layer and the second bottom wiring layer define a ground path, and the ground path surrounds the signal transmitting path.

In an embodiment of the present disclosure, the circuit board structure further includes a filling structure disposed in the first conductive via and the second conductive vias.

In an embodiment of the present disclosure, the equivalent circuit of the signal transmitting structure further includes a fifth equivalent circuit connected between the fourth equivalent circuit and the antenna.

In an embodiment of the present disclosure, the fifth equivalent circuit is composed of a plurality of uniform transmitting sections, and equivalent circuits of the uniform transmitting sections are connected in series according to the ABCD transmission matrix series connection principle, so as to match an impedance.

In an embodiment of the present disclosure, the first top wiring layer includes: a first top pad portion disposed at an end of the first conductive via and electrically connected to the first conductive via; and a first top wiring portion extending from the first top pad portion and electrically connected to the first top pad portion, wherein the fourth equivalent circuit corresponds to the first top pad portion, and the fifth equivalent circuit corresponds to the first top wiring portion.

In an embodiment of the present disclosure, the equivalent circuit of the signal transmitting structure further includes a sixth equivalent circuit connected between the third equivalent circuit and the fourth equivalent circuit or between the first equivalent circuit and the second equivalent circuit, wherein the sixth equivalent circuit corresponds to a structure of a uniform transmitting section.

In an embodiment of the present disclosure, the first build-up structure includes: a first dielectric layer disposed on the first surface of the substrate; a first wiring layer disposed on the first dielectric layer; a second dielectric layer disposed on the first wiring layer; and a second wiring layer disposed on the second dielectric layer, wherein the top wiring layer is disposed on the second wiring layer, wherein the third equivalent circuit corresponds to the first dielectric layer located between the first conductive via and the second conductive vias, and the sixth equivalent circuit corresponds to the second dielectric layer located between the first conductive via and the second conductive vias.

In an embodiment of the present disclosure, the equivalent circuit of the signal transmitting structure further includes a seventh equivalent circuit connected between the third equivalent circuit and the sixth equivalent circuit, wherein the seventh equivalent circuit corresponds to a part of the first wiring layer located between the first conductive via and the second conductive vias.

In an embodiment of the present disclosure, the first wiring layer includes a first inner pad located between the first conductive via and the second conductive vias, wherein the first inner pad is electrically connected to the first conductive via.

In an embodiment of the present disclosure, the circuit board structure further includes a second build-up structure disposed on the second surface of the substrate, wherein the first conductive via and the second conductive vias further penetrate the second build-up structure, wherein the sixth equivalent circuit corresponds to a part of the second build-up structure located between the first conductive via and the second conductive vias, and the first conductive via and a part of the second conductive vias located in the second build-up structure.

In an embodiment of the present disclosure, the second build-up structure includes: a third dielectric layer disposed on the second surface of the substrate; and a third wiring layer disposed on the third dielectric layer, wherein the bottom wiring layer is disposed on the third wiring layer.

In an embodiment of the present disclosure, the first top wiring layer includes a first top wiring extending from an end of the first conductive via and electrically connected to the first conductive via, wherein the fourth equivalent circuit corresponds to the first top wiring.

In an embodiment of the present disclosure, the circuit board structure further includes: a first covering layer disposed on the top wiring layer; and a second covering layer disposed on the bottom wiring layer.

Based on the above, the circuit board structure of the present disclosure has a signal transmitting structure. The equivalent circuit of the signal transmitting structure at least includes a first equivalent circuit, a second equivalent circuit, a third equivalent circuit and a fourth equivalent circuit, which respectively correspond to different uniform transmitting sections, and the signal transmitting path of each uniform transmitting section is surrounded by the ground path and enclosed in a closed manner. Such configuration can reduce energy loss and noise interference, thereby forming a good high-frequency and high-speed signal transmitting loop, and improving signal integrity and reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
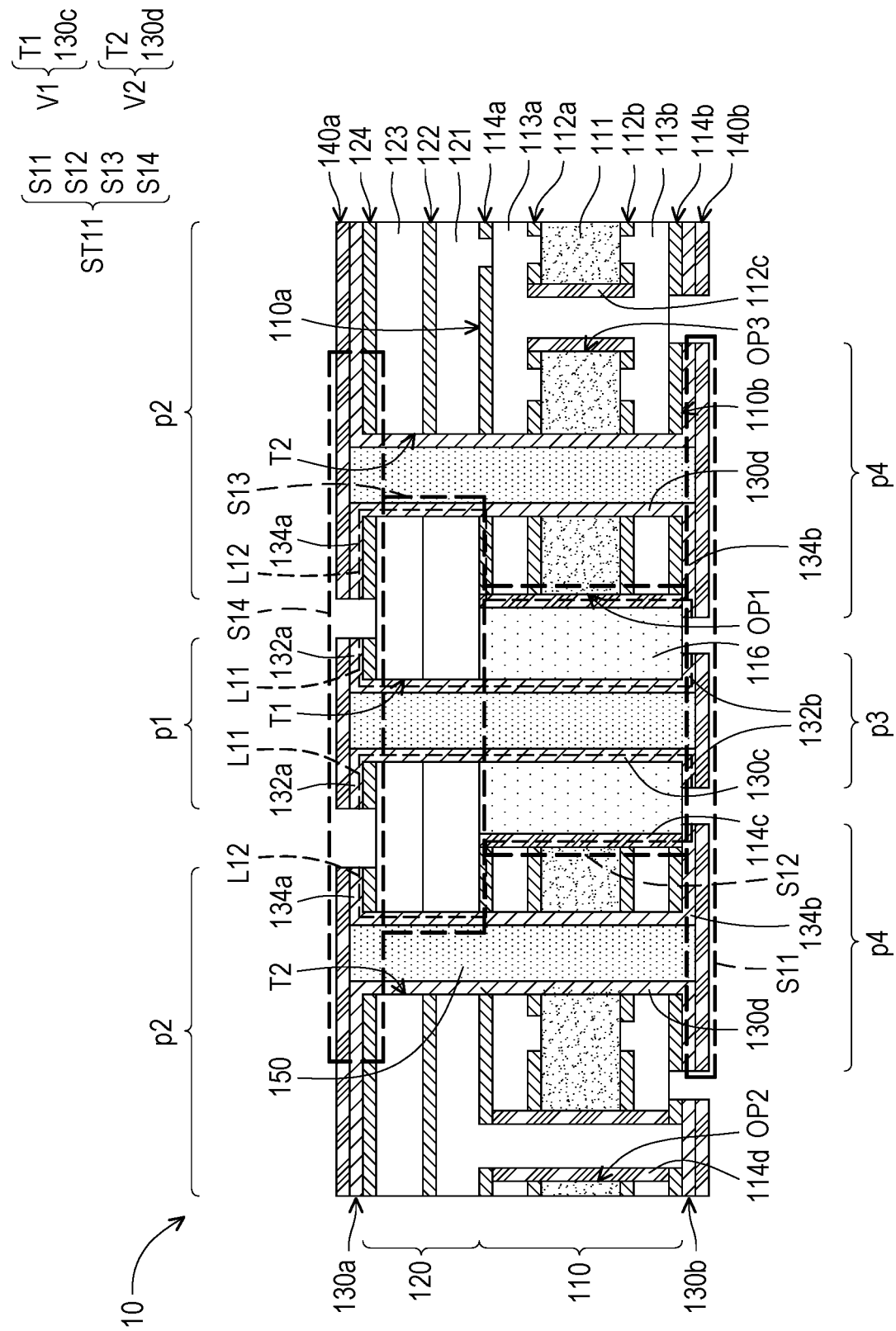
FIG. 1 is a schematic cross-sectional view of a circuit board structure according to an embodiment of the present disclosure.

In the drawings, in order to show the illustrations clearly, the thickness of layers, films, panels and regions are exaggerated. Throughout the specification, the same reference numerals denotes the same element. It should be understood that when it is described that an element on the layer, film, region or substrate is "on" another element or "connected to" another element, it can be either directly on another element or connected to another element; alternatively, an intervening element may be present. On the contrary, when it is described that an element is "directly on another element" or "directly connected to" another element, no intervening element is present there. Herein, the terms "connected to" or "coupled to" may refer to physical and/or electrical connection. Alternatively, the terms "electrically connected" or "coupled to" may refer to that there is another element existed between two elements.

It should be understood that although the terms "first", "second", etc. may be used herein to describe various elements, components, regions, layers and/or sections, these elements, components, regions, and/or sections should not be constrained by limitations of these terms. These terms are only used to distinguish one element, component, region, layer or section from another element, component, region, layer or section. Thus, a "first" element, component, region, layer or section discussed below could be termed a "second" element, component, region, layer or section without departing from the teachings herein.

Figure 2:
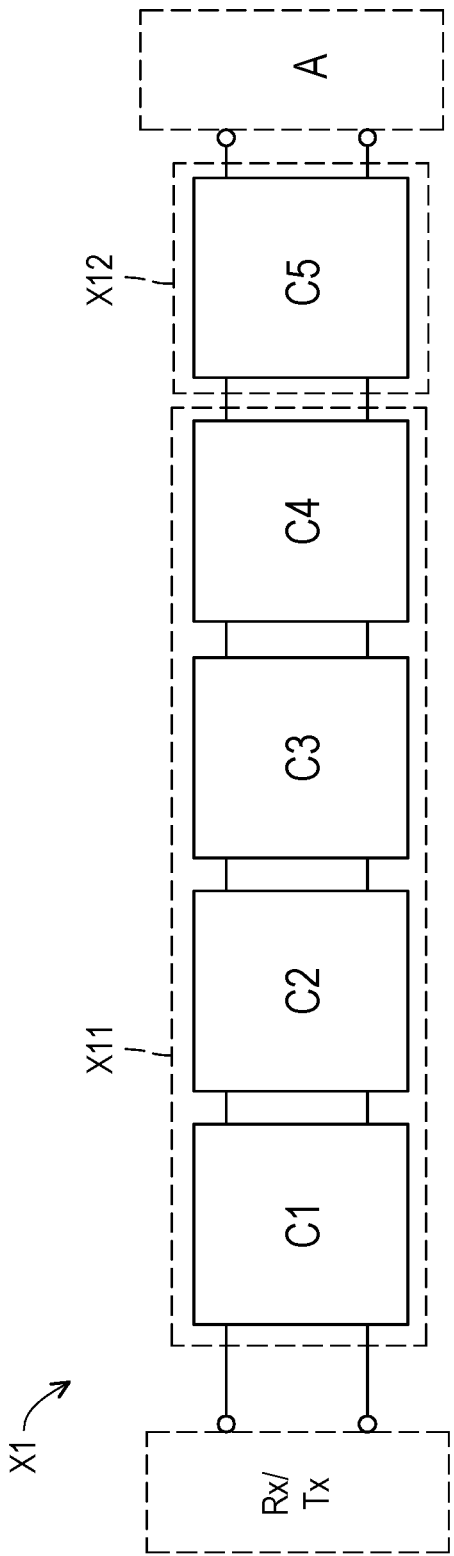
FIG. 2 is a schematic diagram of an equivalent circuit of a signal transmitting structure according to an embodiment of the present disclosure.
Figure 3:
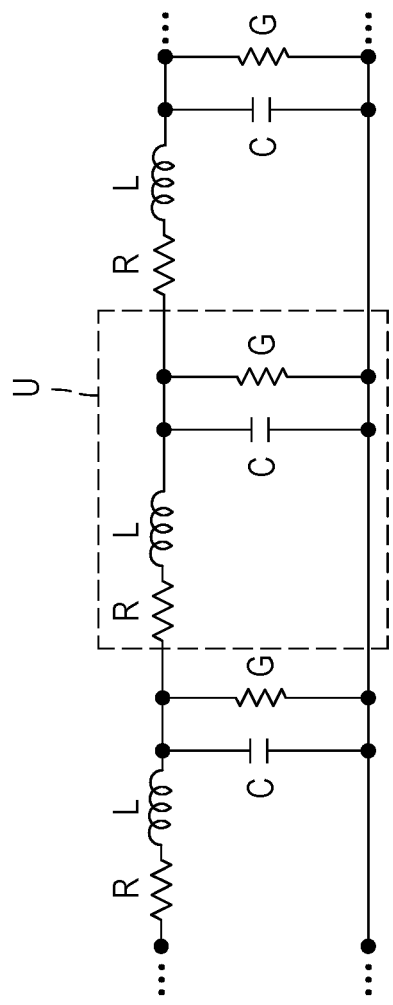
FIG. 3 is a schematic diagram of a partial equivalent circuit of a uniform transmitting section according to an embodiment of the present disclosure.
Figure 4A:
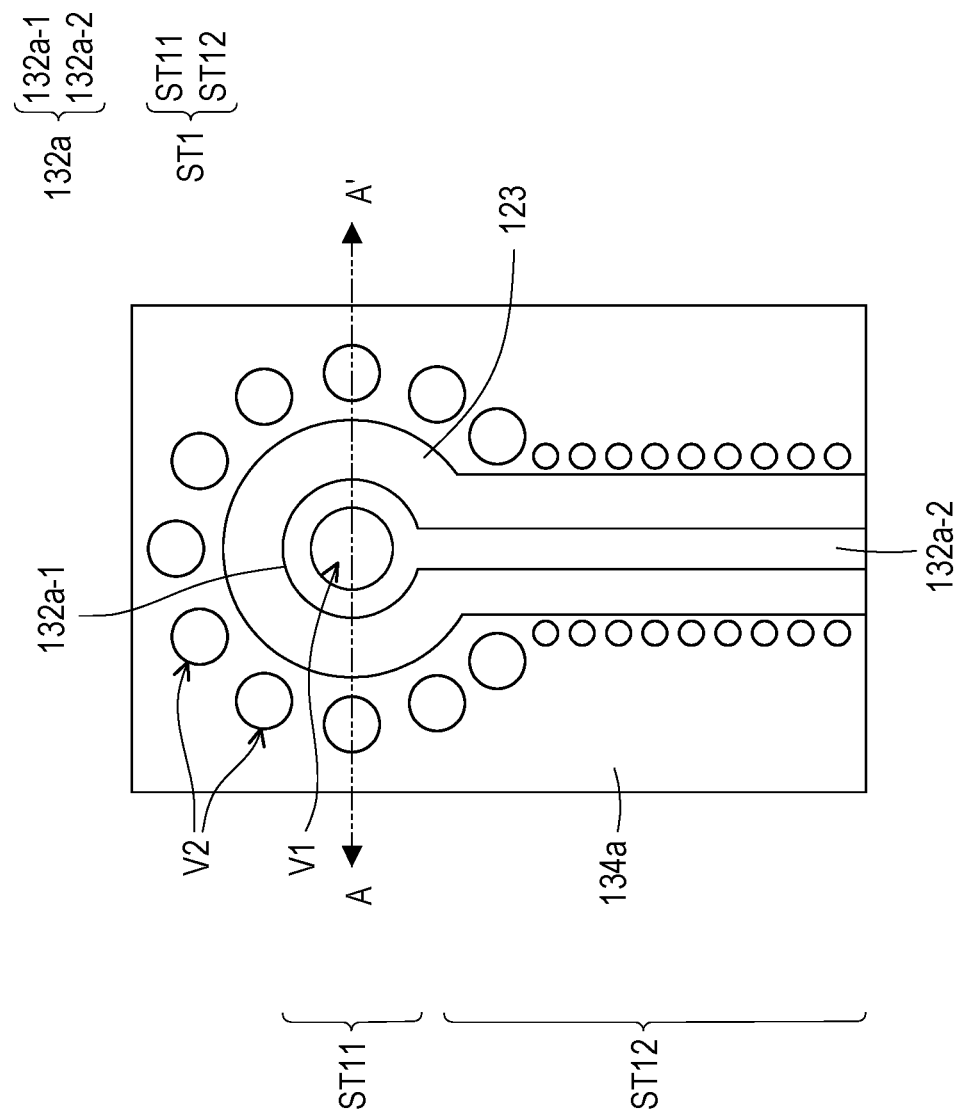
FIG. 4A is a schematic top view of a circuit board structure according to an embodiment of the present disclosure.
Figure 4B:
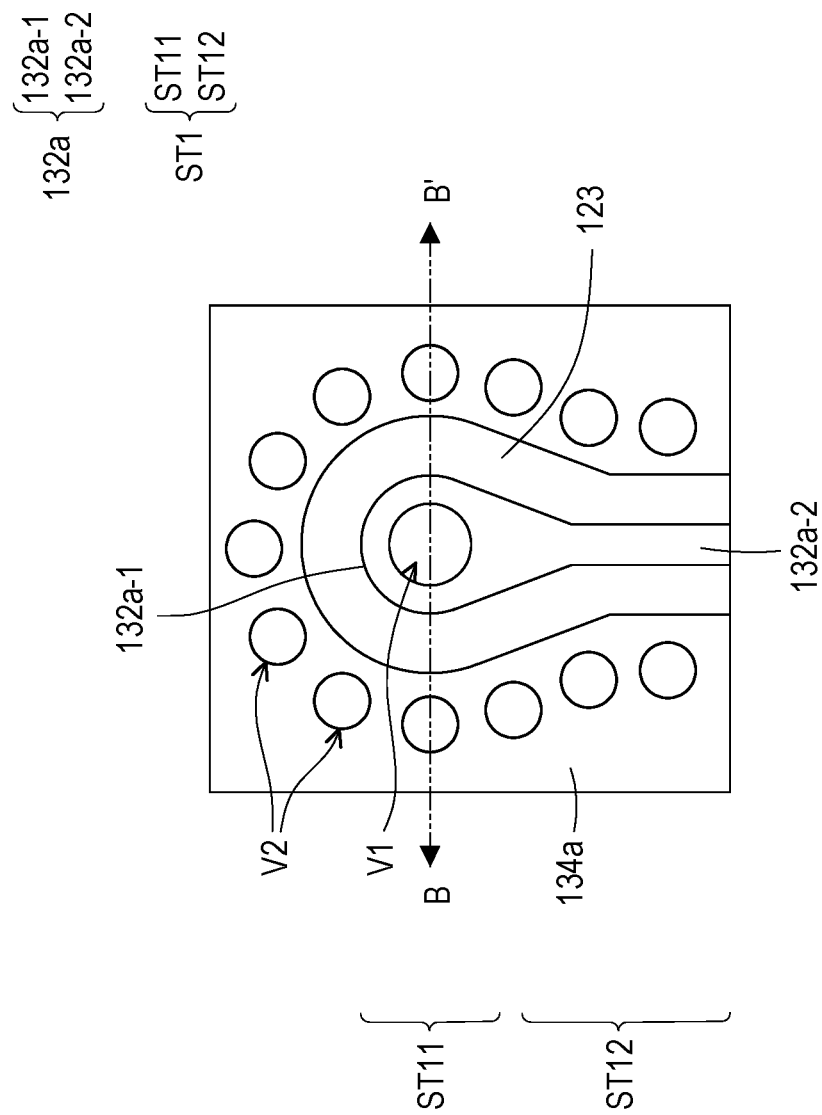
FIG. 4B is a schematic top view of a circuit board structure according to an embodiment of the present disclosure.
Figure 4C:
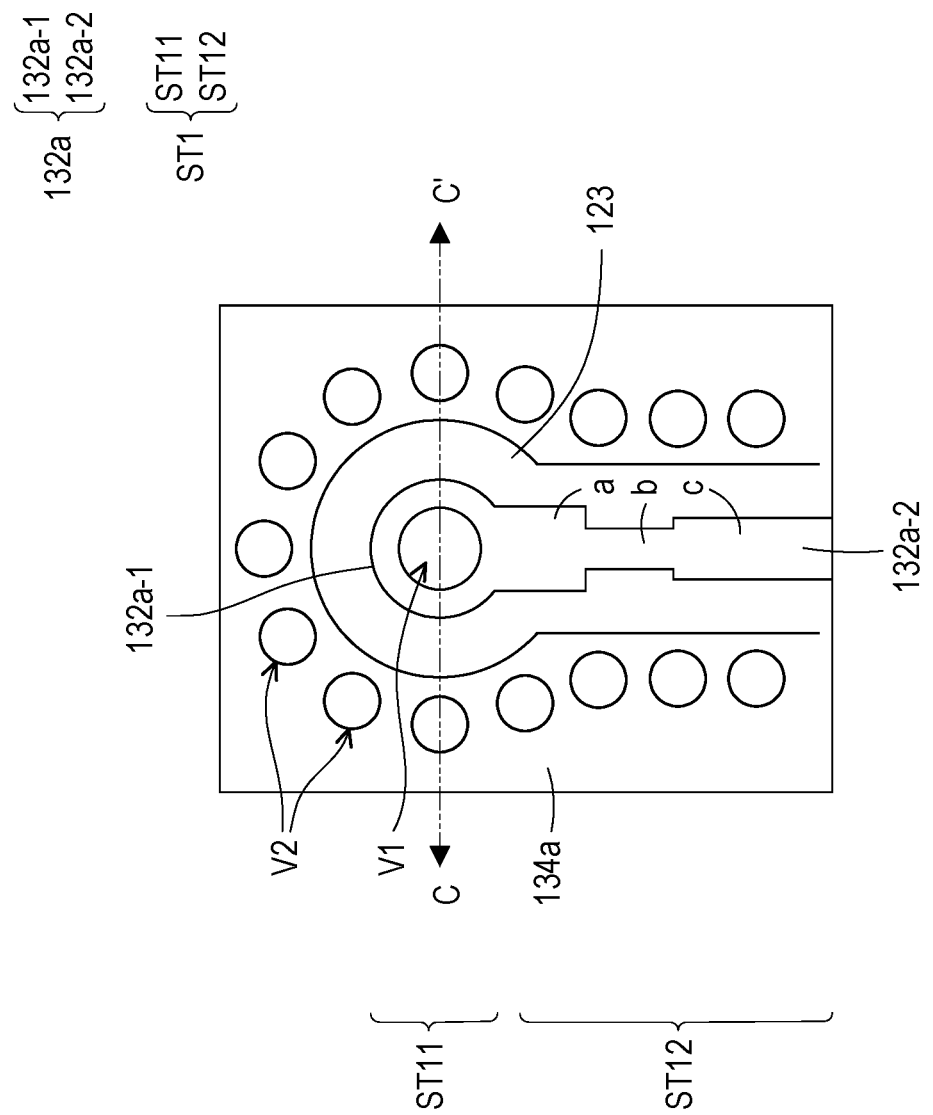
FIG. 4C is a schematic top view of a circuit board structure according to an embodiment of the disclosure.

FIG. 1 is a schematic cross-sectional view of a circuit board structure according to an embodiment of the present disclosure. FIG. 2 is a schematic diagram of an equivalent circuit of a signal transmitting structure according to an embodiment of the present disclosure. FIG. 3 is a schematic diagram of a partial equivalent circuit of a uniform transmitting section according to an embodiment of the present disclosure. FIG. 4A is a schematic top view of a circuit board structure according to an embodiment of the present disclosure. FIG. 4B is a schematic top view of a circuit board structure according to an embodiment of the present disclosure. FIG. 4C is a schematic top view of a circuit board structure according to an embodiment of the disclosure. FIG. 1 may be a schematic cross-sectional view taken along the section line A-A' of FIG. 4A, the section line B-B' of FIG. 4B or the section line C-C' of FIG. 4C. FIG. 2 may be a schematic diagram of an equivalent circuit of the signal transmitting structure in FIG. 1. For clarity, only few elements including a first top wiring layer 132a, a second top wiring layer 134a, a second dielectric layer 123, a first conductive via V1 and second conductive vias V2 are shown in FIGS. 4A to 4C, and other omitted elements are described with reference to FIG. 1.

Referring to FIG. 1 and FIG. 2, a circuit board structure 10 includes a substrate 110, a loop-wrapping ground layer 114c, an insulating structure 116, a first build-up structure 120, a top wiring layer 130a, a bottom wiring layer 130b, a first conductive via V1, and a plurality of second conductive vias V2. The substrate 110 has an opening OP1, a first surface 110a and a second surface 110b opposite to the first surface 110a. The loop-wrapping ground layer 114c (or called "return-surrounding ground layer" in some examples) is disposed on the inner sidewall of the opening OP1 of the substrate 110. The insulating structure 116 is disposed in the opening OP1 of the substrate 110. The first build-up structure 120 is disposed on the first surface 110a of the substrate 110. The top wiring layer 130a is disposed on the first build-up structure 120. The top wiring layer 130a includes a first top wiring layer 132a and a second top wiring layer 134a. The bottom wiring layer 130b is disposed on the second surface 110b of the substrate 110. The bottom wiring layer 130b includes a first bottom wiring layer 132b and a second bottom wiring layer 134b. The first conductive via V1 penetrates through the first build-up structure 120 and the insulating structure 116, and is electrically connected to the first top wiring layer 132a and the first bottom wiring layer 132b. The insulating structure 116 is located between the loop-wrapping ground layer 114c and the first conductive via V1. The second conductive vias V2 penetrate through the substrate 110 and the first build-up structure 120 and surround the first conductive via V1, and are electrically connected to the second top wiring layer 134a and the second bottom wiring layer 134b. The loop-wrapping ground layer 114c is located between the first conductive via V1 and the second conductive vias V2, and is electrically connected to the second conductive vias V2.

The first bottom wiring layer 132b, the first conductive via V1, the first top wiring layer 132a, the second bottom wiring layer 134b, the loop-wrapping ground layer 114c, a part of the second conductive vias V2, the second top wiring layer 134a, the insulating structure 116, and a part of the first build-up structure 120 located between the first conductive via V1 and the second conductive vias V2 define a signal transmitting structure ST1, which is suitable for transmitting high frequency and high speed signals. Herein, the term "high frequency" refers to a frequency greater than 1 GHz; and the term "high speed" refers to a data transmission speed greater than 100 Mbps. The equivalent circuit X1 of the signal transmitting structure ST1 at least includes a first equivalent circuit C1, a second equivalent circuit C2, a third equivalent circuit C3 and a fourth equivalent circuit C4. The first equivalent circuit C1 corresponds to the first bottom wiring layer 132b and the second bottom wiring layer 134b corresponding to the first bottom wiring layer 132b, which may correspond to, for example, a part of a first transmitting section S11 as shown in FIG. 1. The second equivalent circuit C2 corresponds to the loop-wrapping ground layer 114c, the insulating structure 116 and a part of the first conductive via V1 corresponding to the loop-wrapping ground layer 114c, which may correspond to, for example, a part of a transmitting section S12 as shown in FIG. 1. The third equivalent circuit C3 corresponds to a part of the first build-up structure 120 located between the first conductive via V1 and the second conductive vias V2, and a part of the first conductive via V1 and a part of the second conductive vias V2 located in the first build-up structure 120, which may correspond to, for example, a third transmitting section S13 as shown in FIG. 1. The fourth equivalent circuit C4 corresponds to the first top wiring layer 132a and the second top wiring layer 134a corresponding to the first top wiring layer 132a, which may correspond to, for example, a part of a fourth transmitting section S14 as shown in FIG. 1. In some embodiments, the signal transmitting structure ST1 includes a signal transmitting via ST11 composed of a first transmitting section S11, a second transmitting section S12, a third transmitting section S13 and a fourth transmitting section S14.

The first equivalent circuit C1, the second equivalent circuit C2, the third equivalent circuit C3 and the fourth equivalent circuit C4 respectively correspond to different uniform transmitting sections. The first equivalent circuit C1, the second equivalent circuit C2, the third equivalent circuit C3, and the fourth equivalent circuit C4 are connected in series by the principle of series connection of an ABCD transmission matrix (or called "an ABCD transmission matrix connection principle" in some examples). Herein, the term "uniform transmitting section" refers to a transmitting section under a fixed signal frequency, and the unit length parameter of the equivalent circuit of the transmitting section is constant. In detail, as shown in FIG. 3, the equivalent circuit of the uniform transmitting section is composed of multiple RLGC circuit units U connected in series, and each RLGC circuit unit U represents the equivalent circuit of the signal of a unit-length transmitting section in a cross-section. Each RLGC circuit unit U in the equivalent circuit of the uniform transmitting section has the same resistance (R) per unit length, inductance (L) per unit length, conductance (G) per unit length and capacitance (C) per unit length; that is, the unit length parameters (including inductance per unit length, capacitance per unit length, resistance per unit length and conductance per unit length) of the equivalent circuit of the uniform transmitting section are constants.

The term "principle of series connection of an ABCD transmission matrix" refers to different equivalent circuits connected in series. The ABCD transmission matrix can be multiplied sequentially according to the order of series connection to represent the ABCD transmission matrix of the overall equivalent circuit. For example, as shown in FIG. 2, the equivalent circuit X11 of the signal transmitting via ST11 is composed of a first equivalent circuit C1, a second equivalent circuit C2, a third equivalent circuit C3 and a fourth equivalent circuit C4 sequentially connected in series. That is to say, the ABCD transmission matrix of the equivalent circuit X11 is equal to the product of the ABCD transmission matrix of the first equivalent circuit C1, the ABCD transmission matrix of the second equivalent circuit C2, the ABCD transmission matrix of the third equivalent circuit C3, and the ABCD transmission matrix of the circuit C4, as shown in the following equation (1).

$$\begin{bmatrix} A & B \\ C & D \end{bmatrix}_{X11} = \begin{bmatrix} A & B \\ C & D \end{bmatrix}_{C1} \begin{bmatrix} A & B \\ C & D \end{bmatrix}_{C2} \begin{bmatrix} A & B \\ C & D \end{bmatrix}_{C3} \begin{bmatrix} A & B \\ C & D \end{bmatrix}_{C4} \quad (1)$$

The ABCD transmission matrix is composed of a resistance per unit length (R), a inductance per unit length (L), a conductance per unit length (G) and a capacitance per unit length (C) in the equivalent circuit. Equation (2) is an example of the expression of a transmission line.

$$\begin{bmatrix} A & B \\ C & D \end{bmatrix} = \begin{bmatrix} \cosh(\gamma l) & Z_0 \cdot \sinh(\gamma l) \\ \sinh(\gamma l)/Z_0 & \cosh(\gamma l) \end{bmatrix}, \quad (2)$$

where l is a length of a uniform transmitting section, $Z_0$ is a reference impedance, and $\gamma$ is a propagation constant expressed by equation (3):

$$\gamma = \sqrt{(R(f)+j2\pi f L(f))(G(f)+j2\pi f C(f))} \quad (3),$$

where f is a frequency, and R(f), L(f), G(f) and C(f) are frequency-dependent functions of a resistance per unit length, an inductance per unit length, a conductance per unit length, and a capacitance per unit length, respectively.

The ABCD transmission matrix can be further converted into an S-parameter matrix (also known as a "scattering matrix"), so as to obtain the frequency-domain characteristics of the transmitting section. In other words, the frequency domain characteristics of the signal transmitting via ST11 are related to the unit length parameters in the first equivalent circuit C1, the second equivalent circuit C2, the third equivalent circuit C3 and the fourth equivalent circuit C4, and the signal transmitting via ST11 meets the requirement of impedance matching by designing the structure of each transmitting section and adjusting the corresponding unit length parameters.

In some embodiments, the unit length parameter of the first equivalent circuit C1, the unit length parameter of the second equivalent circuit C2, the unit length parameter of the third equivalent circuit C3 and the unit length parameter of the fourth equivalent circuit C4 are different from each other. In other words, the electrical characteristics of the uniform transmitting sections corresponding to the first equivalent circuit C1, the second equivalent circuit C2, the third equivalent circuit C3 and the fourth equivalent circuit C4 are different, e.g., having different geometric shapes or including different dielectric or conductive materials. The signal transmitting via ST11 can meet the requirement of impedance matching by designing the first equivalent circuit C1, the second equivalent circuit C2, the third equivalent circuit C3 and the fourth equivalent circuit C4, and selecting the structures or materials of the corresponding uniform transmitting sections.

In some embodiments, the first bottom wiring layer 132b, the first conductive via V1 and the first top wiring layer 132a define a signal transmitting path L11. The second bottom wiring layer 134b, the loop-wrapping ground layer 114c, the second conductive vias V2 and the second top wiring layer 134a define a ground path L12, and the ground path L12 surrounds the signal transmitting path L11. In this way, the signal transmitting path L11 is surrounded by the ground path L12 in a closed manner. The high-frequency high-speed signals can be transmitted through the signal transmitting path L11, and the return signals are generated through the ground path L12, so as to form a good high-frequency high-speed loop.

In some embodiments, one end of the equivalent circuit X1 of the signal transmitting structure ST1 is connected to a receiver Rx or a transmitter Tx, and another end of the equivalent circuit X1 of the signal transmitting structure ST1 is connected to an antenna A.

In some embodiments, the substrate 110 may include a core layer 111, an inner wiring layer 112a, an inner wiring layer 112b, an inner wiring layer 112c, a dielectric layer 113a, a dielectric layer 113b, a wiring layer 114a, a wiring layer 114b and a wiring layer 114d. The core layer 111 has an opening OP3, the inner wiring layer 112a and the inner wiring layer 112b are disposed on opposite sides of the core layer 111, and the inner wiring layer 112c covers the inner sidewall of the opening OP3, and is structurally and electrically connected to the inner wiring layer 112a and inner layer wiring layer 112b. The dielectric layer 113a covers the inner wiring layer 112a and is located between the inner wiring layer 112a and the wiring layer 114a. The dielectric layer 113b covers the inner wiring layer 112b and is located between the inner wiring layer 112b and the wiring layer 114b. The dielectric layer 113a and the dielectric layer 113b fill the opening OP3 and are connected to each other. The wiring layer 114a is disposed on the dielectric layer 113a, and the wiring layer 114b is disposed on the dielectric layer 113b. The substrate 110 has an opening OP1 and an opening OP2. The opening OP1 penetrates through the wiring layer 114a, the dielectric layer 113a, the inner wiring layer 112a, the core layer 111, the inner wiring layer 112b, the dielectric layer 113b and the wiring layer 114b. The loop-wrapping ground layer 114c covers the inner sidewall of the opening OP1, and is structurally and electrically connected to the wiring layer 114a, the inner wiring layer 112a, the inner wiring layer 112b and the wiring layer 114b. In some embodiments, the loop-wrapping ground layer 114c surrounds a part of the first conductive via V1. In some embodiments, the insulating structure 116 fills the opening OP1 and is flushed with the wiring layer 114a and the wiring layer 114b. In some embodiments, the dielectric layer 113a, the dielectric layer 113b, and the insulating structure 116 use high-frequency and high-speed materials, and the dielectric constant of the insulating structure 116 is selected to meet the requirement of impedance matching. For example, the dielectric loss of the insulating structure 116 is greater than 0 and less than 0.1, and the lower the dielectric loss, the higher the quality of the transmitted signal. The opening OP2 penetrates through the wiring layer 114a, the dielectric layer 113a, the inner wiring layer 112a, the core layer 111, the inner wiring layer 112b, the dielectric layer 113b and the wiring layer 114b. The wiring layer 114d covers the inner sidewall of the opening OP2, and is structurally and electrically connected to the wiring layer 114a, the inner wiring layer 112a, the inner wiring layer 112b and the wiring layer 114b. In some embodiments, the loop-wrapping ground layer 114c is electrically connected to the second conductive vias V2 through the wiring layer 114a. In some embodiments, the opening OP1 is located between the opening OP2 and the opening OP3. FIG. 1 only schematically shows the substrate 110 but is not intended to limit the present disclosure. The substrate 110 may have multiple wiring layers, dielectric layers and openings according to actual needs, and its wiring design may be adjusted according to requirements.

In some embodiments, the first build-up structure 120 includes a first dielectric layer 121, a first wiring layer 122, a second dielectric layer 123 and a second wiring layer 124. The first dielectric layer 121 is disposed on the first surface 110a of the substrate 110. The first wiring layer 122 is disposed on the first dielectric layer 121. The second dielectric layer 123 is disposed on the first wiring layer 122. The second wiring layer 124 is disposed on the second dielectric layer 123, wherein the top wiring layer 130a is disposed on the second wiring layer 124. FIG. 1 only schematically shows the first build-up structure 120 but is not intended to limit the present disclosure. The number of dielectric layers and wiring layers of the first build-up structure 120 can be adjusted according to actual needs.

In some embodiments, the third transmitting section S13 includes the first dielectric layer 121 and the second dielectric layer 123 located between the first conductive via V1 and the second conductive vias V2, and a part of the first conductive via V1 and a part of the second conductive vias V2 located in the first build-up structure 120. The third transmitting section S13 does not include the first wiring layer 122. When the first dielectric layer 121 and the second dielectric layer 123 have the same material, the third transmitting section S13 is regarded as a single uniform transmitting section, which can be equivalent to the third equivalent circuit C3 in FIG. 2. In other embodiments, when the material of the first dielectric layer 121 is different from the material of the second dielectric layer 123, the third transmitting section S13 can be regarded as two different uniform transmitting sections, which respectively correspond to equivalent circuits of transmitting sections with different unit length parameters. However, the present disclosure is not limited thereto.

In some embodiments, the first conductive via V1 includes a through hole T1 and a conductive layer 130c, the through hole T1 penetrates through the first build-up structure layer 120 and the insulating structure 116, and the conductive layer 130c covers the inner sidewall of the through hole T1 and is electrically connected to the first top wiring layer 132a and the first bottom wiring layer 132b. Each of the second conductive via V2 includes a through hole T2 and a conductive layer 130d, the through hole T2 penetrates through the first build-up structure layer 120 and the substrate 110, and the conductive layer 130 d covers the inner sidewall of the through hole T2 and is electrically connected to the second top wiring layer 134a and the second bottom wiring layer 134b. In some embodiments, the through hole T1 penetrates through the center of the insulating structure 116; that is, the through hole T1 and the insulating structure 116 may have the same axis, but the disclosure is not limited thereto. In other embodiments, the through hole T1 may be deviated from the center of the insulating structure 116.

In some embodiments, the circuit board structure 10 further includes a filling structure 150 disposed in the first conductive via V1 and the second conductive vias V2. The material of the filling structure 150 may include resin (as a hole filler or a hole plugging agent), or a dielectric material with a dielectric constant higher than 3.6 and a dielectric loss lower than 0.05. In some embodiments, the filling structure 150 can fill the first conductive via V1 and the second conductive vias V2, so that the top surface of the filling structure 150 is flushed with the top wiring layer 130a, and the bottom surface of the filling structure 150 is flushed with the bottom wiring layer 130b.

In some embodiments, the circuit board structure 10 further includes a first covering layer 140a and a second covering layer 140b. The first covering layer 140a is disposed on the top wiring layer 130a and the filling structure 150, and the second covering layer 140b is disposed on the bottom wiring layer 130b and the filling structure 150.

In some embodiments, the equivalent circuit X1 of the signal transmitting structure ST1 further includes a fifth equivalent circuit C5 connected between the fourth equivalent circuit C4 and the antenna A. For example, the signal transmitting structure ST1 further includes a signal transmitting line ST12 connected to the signal transmitting via ST11. The ABCD transmission matrix of the equivalent circuit X1 of the signal transmitting structure ST1 is equal to the product of the ABCD transmission matrix of the equivalent circuit X11 of the signal transmitting via ST11 and the ABCD transmission matrix of the equivalent circuit X12 of the signal transmitting line ST12, as shown in the following equation (4), wherein the equivalent circuit X12 of the signal transmitting line ST12 includes a fifth equivalent circuit C5; that is, the fifth equivalent circuit C5 corresponds to the signal transmitting line ST12.

$$\begin{bmatrix} A & B \\ C & D \end{bmatrix}_{X1} = \begin{bmatrix} A & B \\ C & D \end{bmatrix}_{X11} \begin{bmatrix} A & B \\ C & D \end{bmatrix}_{X12} \quad (4)$$

In some embodiments, as shown in FIG. 4A, the first top wiring layer 132a includes a first top pad portion 132a-1 and a first top wiring portion 132a-2. The first top pad portion 132a-1 is disposed at the end of the first conductive via V1 and is electrically connected to the first conductive via V1. The first top wiring portion 132a-2 extends from the first top pad portion 132a-1 and is electrically connected to the first top pad portion 132a-1.

In some embodiments, the fourth equivalent circuit C4 may correspond to the first top pad portion 132a-1, and the fifth equivalent circuit C5 may correspond to the first top wiring portion 132a-2. That is to say, the first top wiring part 132a-2 and a part of the second top wiring layer 134a surrounding the first top wiring part 132a-2 can constitute a part of the signal transmitting line ST12; the first top pad portion 132a-1 and a part of the second top wiring layer 134a surrounding the first top pad portion 132a-1 may constitute a part of the fourth transmitting section S14.

In some embodiments, the fifth equivalent circuit C5 may correspond to a plurality of uniform transmitting sections, and the equivalent circuits of the uniform transmitting sections are connected in series according to an ABCD transmission matrix connection principle, so as to match an impedance. For example, in the embodiment of FIG. 4B, the first top wiring portion 132a-2 has a tapered line width near the first top pad portion 132a-1, and different line widths may represent different uniform transmitting sections. With the tapered line width design of the first top wiring portion 132a-2, the fifth equivalent circuit C5 can have expected parameters of resistance, inductance, conductance and capacitance, thereby meeting the requirement of impedance matching. In the embodiment of FIG. 4C, the first top wiring portion 132a-2 may be formed by connecting a plurality of line segments a, b, and c with different line widths; that is, the ABCD transmission matrix of the equivalent circuit of the first top wiring part 132a-2 (i.e. the fifth equivalent circuit C5) is equal to the product of the ABCD transmission matrix of the equivalent circuits of the line segments a, b and c, as shown in the following equation (5).

$$\begin{bmatrix} A & B \\ C & D \end{bmatrix}_{C5} = \begin{bmatrix} A & B \\ C & D \end{bmatrix}_a \begin{bmatrix} A & B \\ C & D \end{bmatrix}_b \begin{bmatrix} A & B \\ C & D \end{bmatrix}_c \qquad (5)$$

In this way, the fifth equivalent circuit C5 can have expected parameters of resistance, inductance, conductance and capacitance by designing the line widths and lengths of the multiple line segments a, b and c, thereby meeting the requirement of impedance matching.

Referring to FIG. 1 and FIG. 4A, in some embodiments, the first top pad portion 132a-1 and its corresponding topmost wiring layer (i.e., the second wiring layer 124) of the first build-up structure 120 and the first covering layer 140a may constitute a first top pad p1. The second top wiring layer 134a and its corresponding topmost wiring layer (i.e., the second wiring layer 124) of the first build-up structure 120 and the first covering layer 140a may constitute a top ground structure p2. The top ground structure p2 surrounds the first top pad p1. In some embodiments, the fourth transmitting section S14 includes the first top pad p1 and a part of the top ground structure p2. When the top wiring layer 130a, the second wiring layer 124 and the first covering layer 140a have the same material, such as copper, the fourth transmitting section S14 is regarded as a single uniform transmitting section, which can be equivalent to the fourth equivalent circuit C4 in FIG. 2. In other embodiments, when the materials of the top wiring layer 130a, the second wiring layer 124, and the first covering layer 140a are different, and the fourth transmitting section S4 can be regarded as three different uniform transmitting sections, which respectively correspond to equivalent circuits of transmitting sections with different unit length parameters. However, the present disclosure is not limited thereto. Although the top ground structure p2 is shown as a blanket structure in FIG. 1, the present disclosure is not limited thereto. The top ground structure p2 may also be patterned to form a plurality of top ground pads (not shown) surrounding the first top pad p1.

In some embodiments, the sidewalls of the first top wiring layer 132a and the corresponding second wiring layer 124 and the first covering layer 140a are flushed with each other. The sidewalls of the second top wiring layer 134a and the corresponding second wiring layer 124 and the first covering layer 140a are flushed with each other.

In some embodiments, the first bottom wiring layer 132b and the corresponding second covering layer 140b may constitute a first bottom pad p3. The second bottom wiring layer 134b and the corresponding second covering layer 140b can constitute a plurality of second bottom pads p4. The second bottom pads p4 surround the first bottom pad p3. In some embodiments, the first transmitting section Si includes a first bottom pad p3 and a plurality of second bottom pads p4. When bottom wiring layer 130b and the second covering layer 140b have the same material, such as copper, the first transmitting section S11 is regarded as a single uniform transmitting section, which can be equivalent to the first equivalent circuit C1 in FIG. 2. In other embodiments, when the materials of the bottom wiring layer 130b and the second covering layer 140b are different, the first transmitting section S11 can be regarded as two different uniform transmitting sections, which respectively correspond to equivalent circuits of transmitting sections with different unit length parameters. However, the present disclosure is not limited thereto.

In some embodiments, the sidewalls of the first bottom wiring layer 132b and the corresponding second covering layer 140b are flushed with each other. The sidewalls of the second bottom wiring layer 134b and the corresponding second covering layer 140b are flushed with each other.

In some embodiments, the first bottom wiring layer 132b may have a pad portion and/or a wiring portion similar to those described in the first top wiring layer 132a, and the disclosure is not limited thereto.

Figure 5:
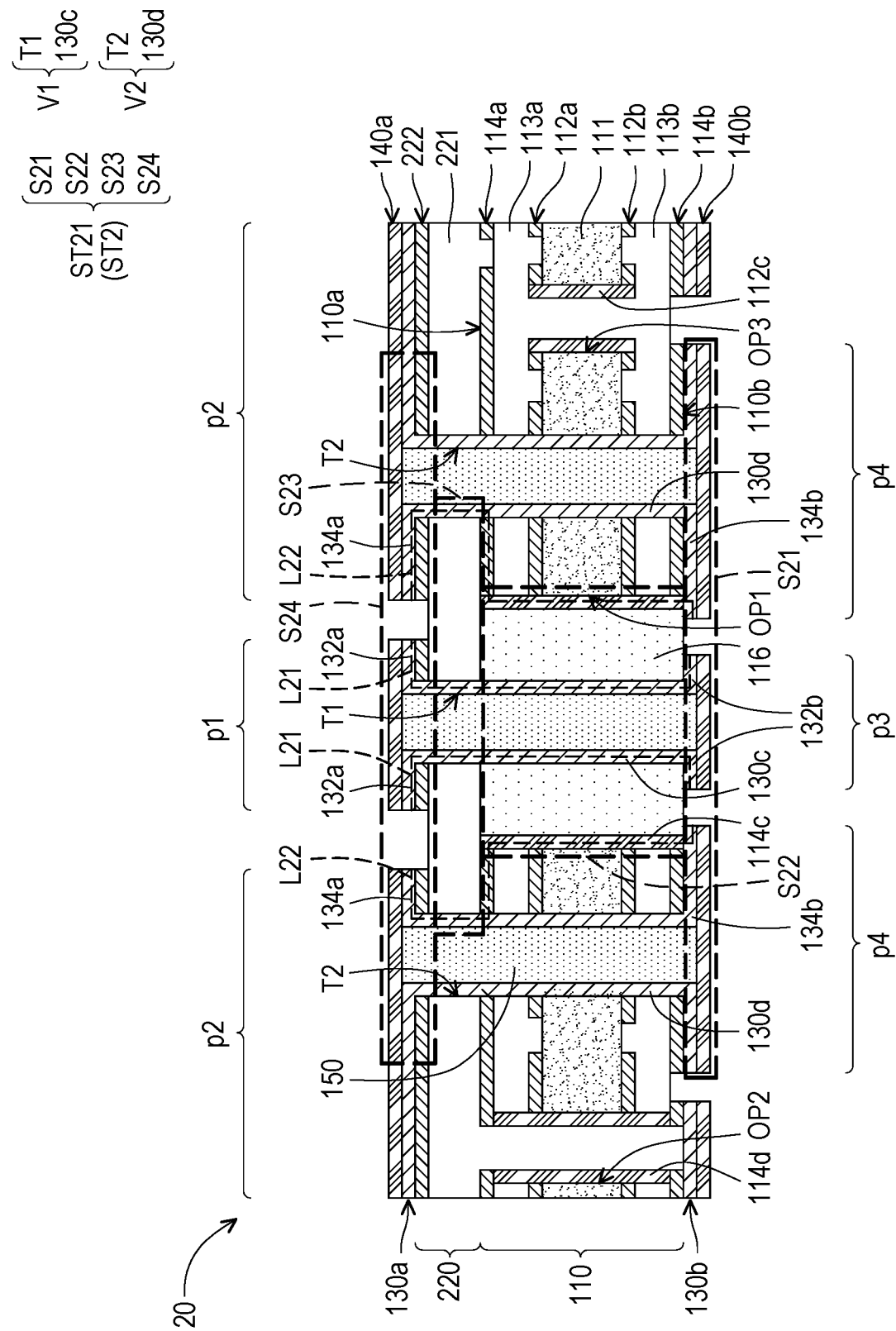
FIG. 5 is a schematic cross-sectional view of a circuit board structure according to another embodiment of the present disclosure.

FIG. 5 is a schematic cross-sectional view of a circuit board structure according to another embodiment of the present disclosure. Herein, it is noted that the embodiment in FIG. 5 continue using reference numbers and a part of the description of the embodiment in FIG. 1, wherein the same or similar reference numbers denote the same or similar elements, and the description of the same technical content is omitted. For the description of the omitted content, reference may be made to the foregoing embodiments, and details are not repeated herein. For the schematic top views of the embodiment of FIG. 5, reference may be made to FIGS. 4A to 4C.

Referring to FIG. 5, the main difference between the circuit board structure 20 and the circuit board structure 10 lies in that, the first build-up structure 220 of the circuit board structure 20 includes a first dielectric layer 221 and a first wiring layer 222. The first dielectric layer 221 is disposed on the first surface 110a of the substrate 110. The first wiring layer 222 is disposed on the first dielectric layer 221, wherein the top wiring layer 130a is disposed on the second wiring layer 222.

A first bottom wiring layer 132b, a first conductive via V1, a first top wiring layer 132a, a second bottom wiring layer 134b, a part of the second conductive vias V2, a loop-wrapping ground layer 114c, a second top wiring layer 134a, an insulating structure 116, and a part of the first build-up structure 220 located between the first conductive via V1 and the second conductive vias V2 define a signal transmitting structure ST2. FIG. 2 shows the equivalent circuit of the signal transmitting structure ST2, wherein the first equivalent circuit C1 corresponds to the first bottom wiring layer 132b and the second bottom wiring layer 134b corresponding to the first bottom wiring layer 132b, which may correspond to, for example, a part of a first transmitting section S21 as shown in FIG. 5. The second equivalent circuit C2 corresponds to the loop-wrapping ground layer 114c, the insulating structure 116, and a part of the first conductive via V1 corresponding to the loop-wrapping ground layer 114c, which may correspond to, for example, a part of a second transmitting section S22 as shown in FIG. 5. The third equivalent circuit C3 corresponds to the first dielectric layer 221 located between the first conductive via V1 and the second conductive vias V2, and a part of the first conductive via V1 and a part of the second conductive vias V2 located in the first build-up structure 220, which may correspond to, for example, a third transmitting section S23 as shown in FIG. 5. The fourth equivalent circuit C4 corresponds to the first top pad portion 132a-1 and the second top wiring layer 134a corresponding to the first top pad portion 132a-1, which may correspond to, for example, a part of a fourth transmitting sections S24 as shown in FIG. 5. The fifth equivalent circuit C5 corresponds to the first top wiring portion 132a-2 and the second top wiring layer 134a corresponding to the first top wiring portion 132a-2, as shown in FIGS. 4A to 4C. In some embodiments, the signal transmitting structure ST2 includes a signal transmitting via ST21 and a signal transmitting line ST12 (with reference to FIG. 4A to FIG. 4C), and the signal transmitting line ST12 is composed of a first transmitting section S21, a second transmitting section S22, a transmitting section S23 and a fourth transmitting section S24.

The first bottom wiring layer 132b, the first conductive via V1 and the first top wiring layer 132a define a signal transmitting path L21. The second bottom wiring layer 134b, the loop-wrapping ground layer 114c, the second conductive vias V2 and the second top wiring layer 134a define a ground path L22, and the ground path L22 surrounds the signal transmitting path L21. In this way, the signal transmitting path L21 is surrounded by the ground path L22 in a closed manner. The high-frequency high-speed signals can be transmitted through the signal transmitting path L21, and the return signals are generated through the ground path L22, so as to form a good high-frequency high-speed loop.

Figure 6:
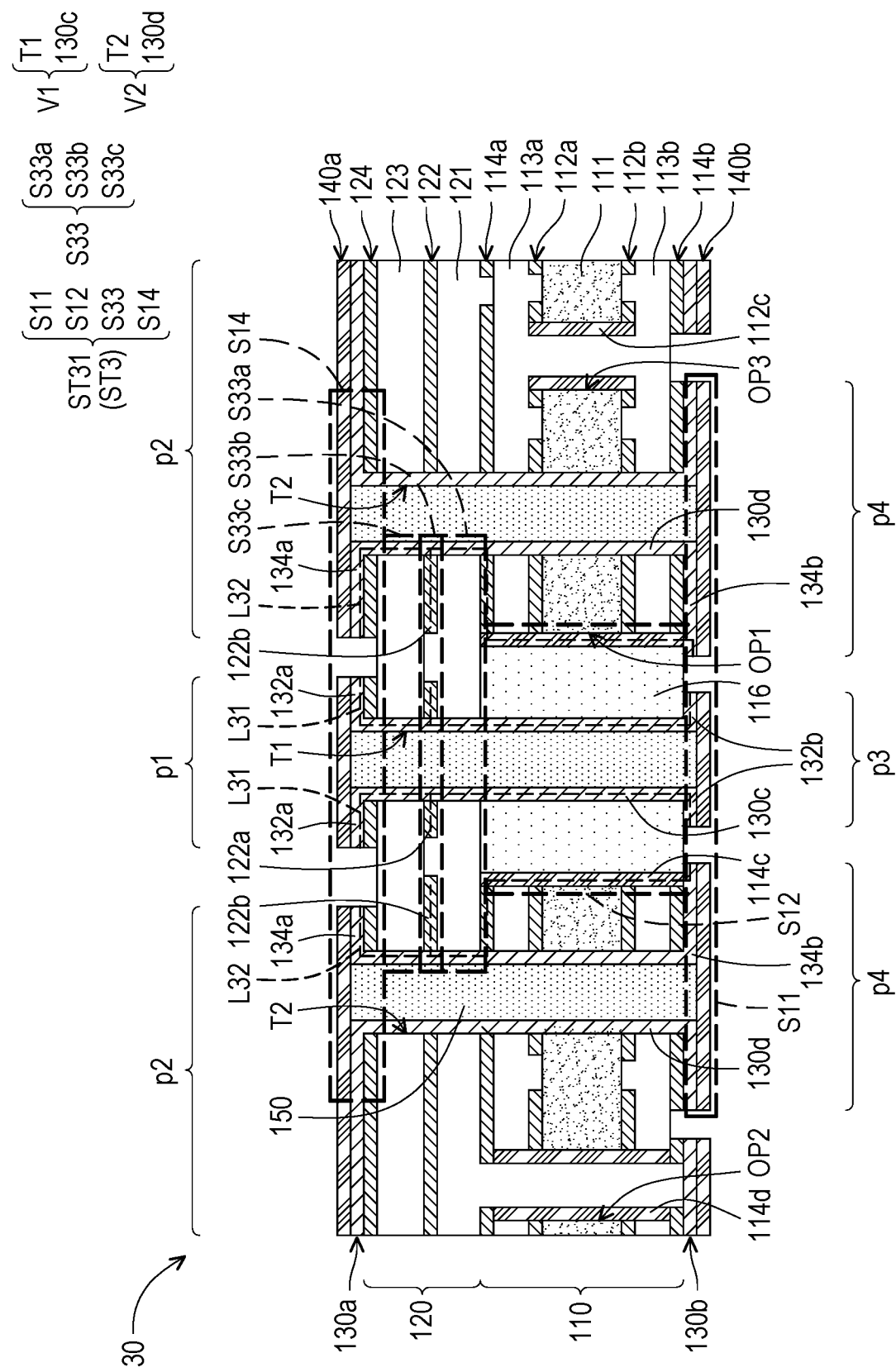
FIG. 6 is a schematic cross-sectional view of a circuit board structure according to another embodiment of the present disclosure.
Figure 7:
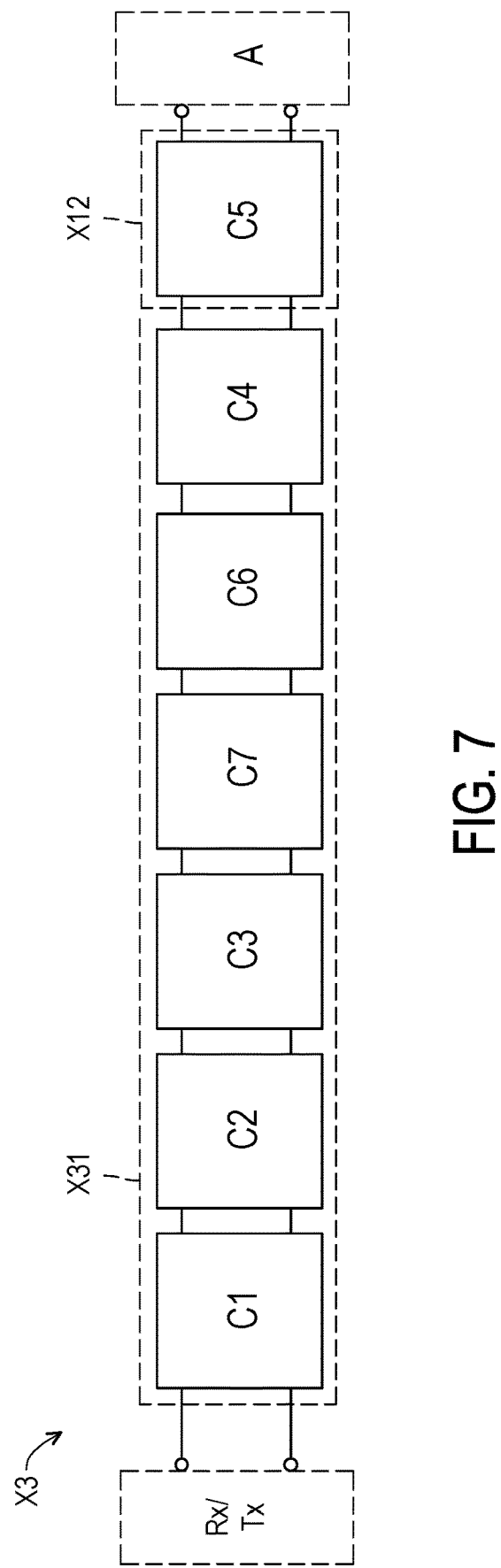
FIG. 7 is a schematic diagram of an equivalent circuit of a signal transmitting structure according to another embodiment of the present disclosure.

FIG. 6 is a schematic cross-sectional view of a circuit board structure according to another embodiment of the present disclosure. FIG. 7 is a schematic diagram of an equivalent circuit of a signal transmitting structure according to another embodiment of the present disclosure. FIG. 7 may be a schematic diagram of an equivalent circuit of the signal transmitting structure ST3 in FIG. 6. Herein, it is noted that the embodiment in FIG. 6 continues using reference numbers and a part of the description of the embodiment in FIG. 1, wherein the same or similar reference numbers denote the same or similar elements, and the description of the same technical content is omitted. For the description of the omitted content, reference may be made to the foregoing embodiments, and details are not repeated herein. For the schematic top views of the embodiment of FIG. 6, reference may be made to FIGS. 4A to 4C.

Referring to FIG. 6, the main difference between the circuit board structure 30 and the circuit board structure 10 lies in that, the first wiring layer 122 of the circuit board structure 30 includes first inner pads 122a and second inner pads 122b between a first conductive via V1 and second conductive vias V2. The first inner pads 122a are electrically connected to the first conductive via V1, and the second inner pads 122b are electrically connected to the second conductive vias V2. In other embodiments, the first wiring layer 122 located between the first conductive via V1 and the second conductive vias V2 may only include the first inner pads 122a or the second inner pads 122b, but the present disclosure is not limited thereto. The configuration of the first inner pads 122a and the second inner pads 122b can be adjusted according to actual needs, so as to meet the requirement of impedance matching.

A first bottom wiring layer 132b, a first conductive via V1, a first top wiring layer 132a, a second bottom wiring layer 134b, a part of the second conductive vias V2, a loop-wrapping ground layer 114c, a second top wiring layer 134a, an insulating structure 116, and a part of the first build-up structure 120 located between the first conductive via V1 and the second conductive vias V2 define a signal transmitting structure ST3. The signal transmitting structure ST3 includes a signal transmitting via ST31 and a signal transmitting line ST12 (with reference to FIG. 4A to FIG. 4C). The signal transmitting via ST31 is composed of a first transmitting section S11, a second transmitting section S12, a third transmitting section S33 and a fourth transmitting section S14. The third transmitting section S33 includes a plurality of uniform sub-transmitting sections S33a, S33b and S33c. The uniform sub-transmitting section S33a includes a first dielectric layer 121 located between the first conductive via V1 and the second conductive vias V2, and a part of the first conductive via V1 and a part of the second conductive vias V2 located in the first dielectric layer 121. The uniform sub-transmitting section S33b includes the first inner pads 122a, the second inner pads 122b, and a part of the first dielectric layer 121 located between the first inner pads 122a and the second inner pads 122b. The uniform sub-transmitting section S33c includes a second dielectric layer 123 located between the first conductive via V1 and the second conductive vias V2, and a part of the first conductive via V1 and a part of the second conductive vias V2 located in the second dielectric layer 123.

As shown in FIG. 7, the equivalent circuit X3 of the signal transmitting structure ST3 can include a first equivalent circuit C1, a second equivalent circuit C2, a third equivalent circuit C3, a seventh equivalent circuit C7, a sixth equivalent circuits C6, a fourth equivalent circuit C4 and a fifth equivalent circuit C5 connected in sequence. The first equivalent circuit C1 corresponds to the first bottom wiring layer 132b and the second bottom wiring layer 134b corresponding to the first bottom wiring layer 132b, which may correspond to, for example, the first transmitting section S11 as shown in FIG. 6. The second equivalent circuit C2 corresponds to the loop-wrapping ground layer 114c, the insulating structure 116, and a part of the first conductive via V1 corresponding to the loop-wrapping ground layer 114c, which may correspond to, for example, the second transmitting section S12 as shown in shown in FIG. 6. The third equivalent circuit C3 corresponds to the first dielectric layer 121 located between the first conductive via V1 and the second conductive vias V2, which may correspond to, for example, the uniform sub-transmitting section S33a of the third transmitting section S33 as shown in FIG. 6. The seventh equivalent circuit C7 corresponds to the first wiring layer 122 located between the first conductive via V1 and the second conductive vias V2, which may correspond to, for example, the uniform sub-transmitting section S33b of the third transmitting section S33 as shown in FIG. 6. The sixth equivalent circuit C6 corresponds to the second dielectric layer 123 located between the first conductive via V1 and the second conductive vias V2, which may correspond to, for example, the uniform sub-transmitting section S33c of the third transmitting section S33 as shown in FIG. 6. The fourth equivalent circuit C4 corresponds to the first top pad portion 132a-1 and the second top wiring layer 134a corresponding to the first top pad portion 132a-1, which may correspond to, for example, the fourth transmitting section S14 as shown in FIG. 6. The fifth equivalent circuit C5 corresponds to the first top wiring portion 132a-2 and the second top wiring layer 134a corresponding to the first top wiring portion 132a-2, as shown in FIGS. 4A to 4C. In some embodiments, the equivalent circuit X31 of the signal transmitting via ST31 is composed of a first equivalent circuit C1, a second equivalent circuit C2, a third equivalent circuit C3, a seventh equivalent circuit C7, and a sixth equivalent circuit C6 and a fourth equivalent circuit C4 connected in series according to the ABCD transmission matrix connection principle.

The first bottom wiring layer 132b, the first conductive via V1, the first inner pads 122a and the first top wiring layer 132a define a signal transmitting path L31. The second bottom wiring layer 134b, the loop-wrapping ground layer 114c, the second conductive vias V2, the second inner pads 122b and the second top wiring layer 134a define a ground path L32, and the ground path L32 surrounds the signal transmitting path L31. In this way, the signal transmitting path L31 is surrounded by the ground path L32 in a closed manner. The high-frequency high-speed signals can be transmitted through the signal transmitting path L31, and return signals are generated through the ground path L32, so as to form a good high-frequency high-speed loop.

Figure 8:
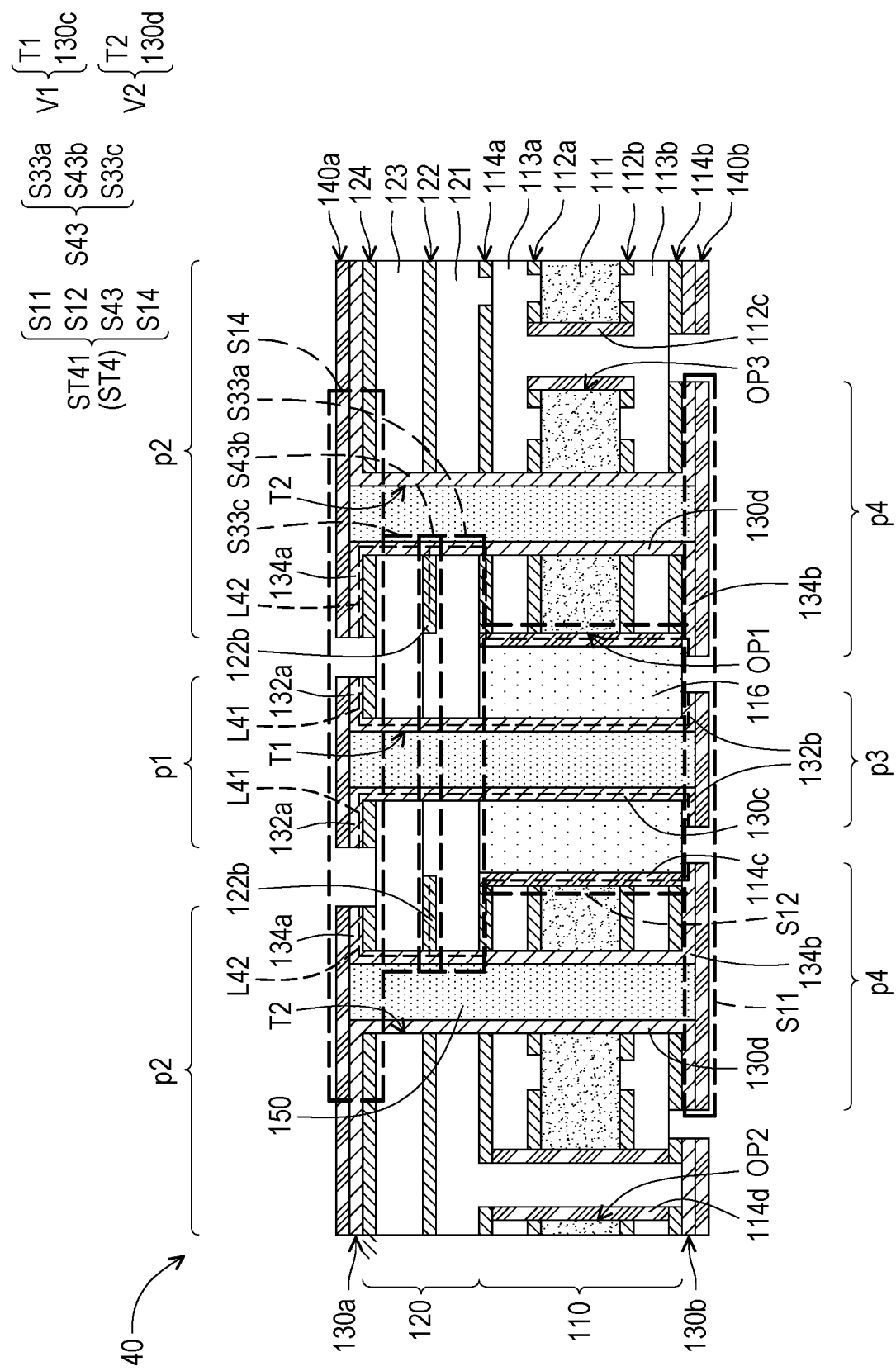
FIG. 8 is a schematic cross-sectional view of a circuit board structure according to another embodiment of the present disclosure.

FIG. 8 is a schematic cross-sectional view of a circuit board structure according to another embodiment of the present disclosure. Herein, it is noted that the embodiment in FIG. 8 continue using some reference numbers and a part of the description of the embodiment in FIG. 6, wherein the same or similar reference numbers denote the same or similar elements, and the description of the same technical content is omitted. For the description of the omitted content, reference may be made to the foregoing embodiments, and details are not repeated herein. For the schematic top views of the embodiment of FIG. 8, reference may be made to FIGS. 4A to 4C.

Please refer to FIG. 8, the main difference between the circuit board structure 40 and the circuit board structure 30 lies in that: the first wiring layer 122 of the circuit board structure 40 includes second inner pads 122b between a first conductive via V1 and second conductive vias V2, but does not include first inner pads. A first bottom wiring layer 132b, a first conductive via V1, a first top wiring layer 132a, a second bottom wiring layer 134b, a part of the second conductive vias V2, a loop-wrapping ground layer 114c, a second top wiring layer 134a, an insulating structure 116, and a part of the first build-up structure 120 located between the first conductive via V1 and the second conductive vias V2 define a signal transmitting structure ST4. The signal transmitting structure ST4 includes a signal transmitting via ST41 and a signal transmitting line ST12 (with reference to FIG. 4A to FIG. 4C). The signal transmitting via ST41 is composed of a first transmitting section S11, a second transmitting section S12, a third transmitting section S43 and a fourth transmitting section S14. The third transmitting section S43 includes a plurality of uniform sub-transmitting sections S33a, S43b and S33c, wherein the uniform sub-transmitting section S43b includes the second inner pads 122b, the first conductive via V1 corresponding to the second inner pads 122b, and a part of the dielectric layer 121 located between the first conductive via V1 and the second inner pads 122b.

As shown in FIG. 7, the equivalent circuit X4 of the signal transmitting structure ST4 can include a first equivalent circuit C1, a second equivalent circuit C2, a third equivalent circuit C3, a seventh equivalent circuit C7, a sixth equivalent circuits C6, a fourth equivalent circuit C4 and a fifth equivalent circuit C5 connected in sequence. The first equivalent circuit C1 corresponds to the first bottom wiring layer 132b and the second bottom wiring layer 134b corresponding to the first bottom wiring layer 132b, which may correspond to, for example, the first transmitting section S11 as shown in FIG. 8. The second equivalent circuit C2 corresponds to the loop-wrapping ground layer 114c, the insulating structure 116 and a part of the first conductive via V1 corresponding to the loop-wrapping ground layer 114c, which may correspond to, for example, the second transmitting section S12 as shown in FIG. 8. The third equivalent circuit C3 corresponds to the first dielectric layer 121 located between the first conductive via V1 and the second conductive vias V2, which may correspond to, for example, the uniform sub-transmitting section S33a of the third transmitting section S43 as shown in FIG. 8. The seventh equivalent circuit C7 may correspond to the first wiring layer 122 located between the first conductive via V1 and the second conductive vias V2, which may correspond to, for example, the uniform sub-transmitting section S43b of the third transmitting section S43 as shown in FIG. 7. The sixth equivalent circuit C6 corresponds to the second dielectric layer 123 located between the first conductive via V1 and the second conductive vias V2, which may correspond to, for example, the uniform sub-transmitting section S33c of the third transmitting section S43 as shown in FIG. 8. The fourth equivalent circuit C4 corresponds to the first top pad portion 132a-1 and the second top wiring layer 134a corresponding to the first top pad portion 132a-1, which may correspond to, for example, the fourth transmitting section S14 as shown in FIG. 8. The fifth equivalent circuit C5 corresponds to the first top wiring portion 132a-2 and the second top wiring layer 134a corresponding to the first top wiring portion 132a-2, as shown in FIGS. 4A to 4C.

The first bottom wiring layer 132b, the first conductive via V1 and the first top wiring layer 132a define a signal transmitting path L41. The second bottom wiring layer 134b, the loop-wrapping ground layer 114c, the second conductive vias V2, the second inner pads 122b and the second top wiring layer 134a define a ground path L42, and the ground path L42 surrounds the signal transmitting path L41. In this way, the signal transmitting path L41 is surrounded by the ground path L42 in a closed manner. The high-frequency high-speed signals can be transmitted through the signal transmitting path L41, and the return signals are generated through the ground path L42, so as to form a good high-frequency high-speed loop.

Figure 9:
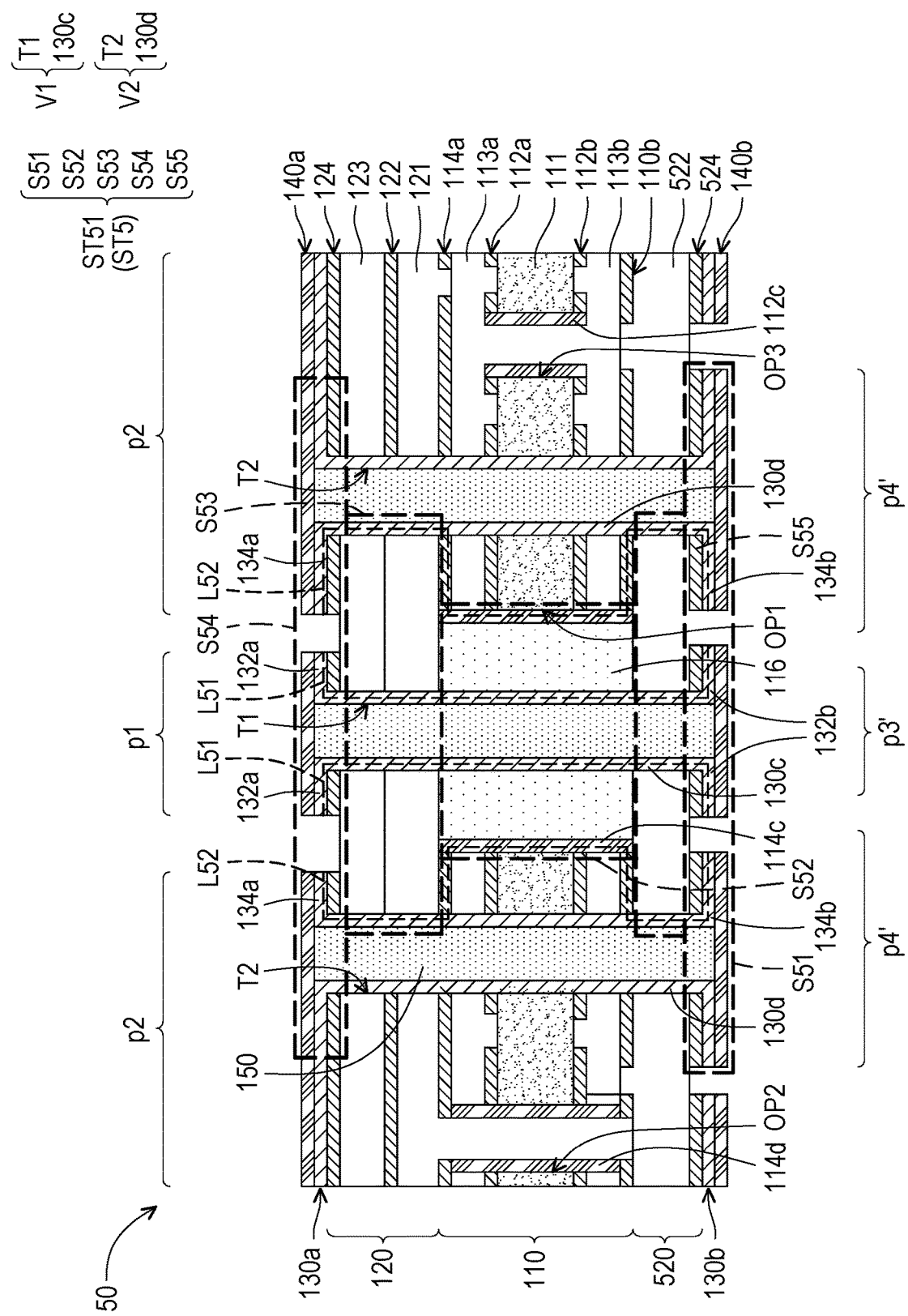
FIG. 9 is a schematic cross-sectional view of a circuit board structure according to another embodiment of the present disclosure.
Figure 10:
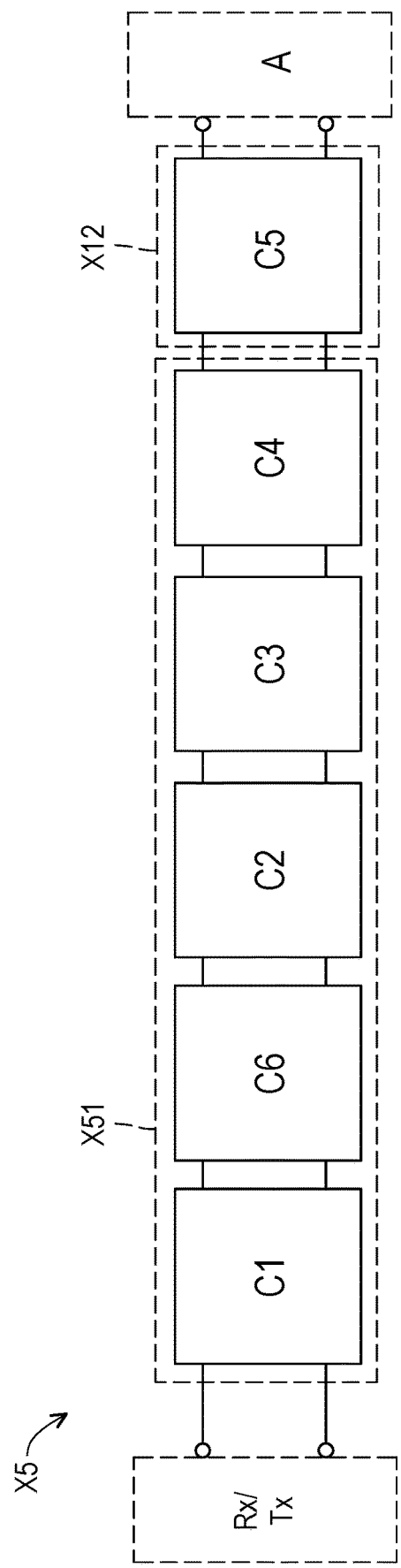
FIG. 10 is a schematic diagram of an equivalent circuit of a signal transmitting structure according to another embodiment of the present disclosure.

FIG. 9 is a schematic cross-sectional view of a circuit board structure according to another embodiment of the present disclosure. FIG. 10 is a schematic diagram of an equivalent circuit of a signal transmitting structure according to another embodiment of the present disclosure. FIG. 10 may be a schematic diagram of an equivalent circuit of the signal transmitting structure ST5 in FIG. 9. Herein, it is noted that the embodiment in FIG. 9 continue using some reference numbers and a part of the description of the embodiment in FIG. 1, wherein the same or similar reference numbers denote the same or similar elements, and the description of the same technical content is omitted. For the description of the omitted content, reference may be made to the foregoing embodiments, and details are not repeated herein. For the schematic top views of the embodiment of FIG. 9, reference may be made to FIGS. 4A to 4C.

Referring to FIG. 9, the main difference between the circuit board structure 50 and the circuit board structure 10 lies in that, the circuit board structure 50 further includes a second build-up structure 520 disposed on the second surface 110b of the substrate 110, the first conductive via V1 and second conductive vias V2 further penetrate the second build-up structure 520. For example, the second build-up structure 520 may include a third dielectric layer 522 and a third wiring layer 524. The third dielectric layer 522 is disposed on the second surface 110b of the substrate 110, the third wiring layer 524 is disposed on the third dielectric layer 522, and the bottom wiring layer 130 b is disposed on the third wiring layer 524. In some embodiments, the loop-wrapping ground layer 114c is electrically connected to the second conductive vias V2 through the wiring layers 114a and 114b. FIG. 9 only schematically shows the second build-up structure 520 but is not intended to limit the present disclosure. The number of dielectric layers and wiring layers of the second build-up structure 520 can be adjusted according to actual needs.

A first bottom wiring layer 132b, a first conductive via V1, a first top wiring layer 132a, a second bottom wiring layer 134b, a part of the second conductive vias V2, a loop-wrapping ground layer 114c, a second top wiring layer 134a, an insulating structure 116, and a part of the first build-up structure 120 located between the first conductive via V1 and the second conductive vias V2 define a signal transmitting structure ST5.

As shown in FIG. 10, the equivalent circuit X5 of the signal transmitting structure ST5 can include a first equivalent circuit C1, a sixth equivalent circuit C6, a second equivalent circuit C2, a third equivalent circuit C3, a fourth equivalent circuits C4 and a fifth equivalent circuit C5 connected in sequence. The first equivalent circuit C1 corresponds to the first bottom wiring layer 132b and the second bottom wiring layer 134b corresponding to the first bottom wiring layer 132b, which may correspond to, for example, the first transmitting section S51 as shown in FIG. 9. The sixth equivalent circuit C6 corresponds to a part of the second build-up structure 520 (such as the third dielectric layer 522) located between the first conductive via V1 and the second conductive vias V1, and a part of the first conductive via V1 and a part of the second conductive vias V2 located in the e second build-up structure 520, which may correspond to, for example, the fifth transmitting section S55 as shown in FIG. 9. The second equivalent circuit C2 corresponds to the loop-wrapping ground layer 114c, the insulating structure 116, and a part of the first conductive via V1 corresponding to the loop-wrapping ground layer 114c, which may correspond to, for example, the second transmitting section S52 as shown in FIG. 9. The third equivalent circuit C3 corresponds to the first dielectric layer 121 located between the first conductive via V1 and the second conductive vias V2, which may correspond to, for example, the third transmitting section S53 as shown in FIG. 9. The fourth equivalent circuit C4 corresponds to the first top pad portion 132a-1 and the second top wiring layer 134a corresponding to the first top pad portion 132a-1, which may correspond to, for example, the fourth transmitting section S54 as shown in FIG. 9. The fifth equivalent circuit C5 corresponds to the first top wiring portion 132a-2 and the second top wiring layer 134a corresponding to the first top wiring portion 132a-2, as shown in FIGS. 4A to 4C. In some embodiments, the signal transmitting structure ST5 includes a signal transmitting via ST51 and a signal transmitting line ST12 (with reference to FIG. 4A to FIG. 4C). The signal transmitting via ST51 is composed of a first transmitting section S51, a second transmitting section S52, a transmitting section S53, a fourth transmitting section S54 and a fifth transmitting section S55. In some embodiments, the equivalent circuit X51 of the signal transmitting via ST51 is composed of a first equivalent circuit C1, a sixth equivalent circuit C6, a second equivalent circuit C2, a third equivalent circuit C3 and a fourth equivalent circuit C4 according to the ABCD transmission matrix connection principle.

In some embodiments, the first bottom wiring layer 132b and the corresponding second covering layer 140b and third wiring layer 524 may constitute a first bottom pad p3'. The second bottom wiring layer 134b and the corresponding second covering layer 140b and third wiring layer 524 may constitute a plurality of second bottom pads p4'. The second bottom pads p4' surround the first bottom pad p3'. In some embodiments, the first transmitting section S51 includes a first bottom pad p3' and a plurality of second bottom pads p4'. When a bottom wiring layer 130b, the third wiring layer 524 and the second covering layer 140b have the same material, such as copper, the first transmitting section S51 is regarded as a single uniform transmitting section, which can be equivalent to the first equivalent circuit C1 in FIG. 10. In other embodiments, when the materials of the bottom wiring layer 130b, the third wiring layer 524, and the second covering layer 140b are different, and the first transmitting section S51 may be regarded as three different uniform transmitting sections, which respectively correspond to equivalent circuits of transmitting sections with different unit length parameters. However, the present disclosure is not limited thereto.

In some embodiments, the sidewalls of the first bottom wiring layer 132b and the corresponding third wiring layer 524 and the second covering layer 140b are flushed with each other. The sidewalls of the second bottom wiring layer 134b and the corresponding third wiring layer 524 and the second covering layer 140b are flushed with each other.

The first bottom wiring layer 132b, the first conductive via V1 and the first top wiring layer 132a define a signal transmitting path L51, the second bottom wiring layer 134b, the second conductive vias V2, the wiring layer 114b, the loop-wrapping ground layer 114c, the wiring layer 114a and the second top wiring layer 134a define a ground path L52, and the ground path L52 surrounds the signal transmitting path L51. In this way, the signal transmitting path L51 is surrounded by the ground path L52 and is enclosed in a closed manner. The high-frequency high-speed signals can be transmitted through the signal transmitting path L51, and the return signals are generated through the ground path L52, so as to form a good high-frequency high-speed loop.

Figure 11:
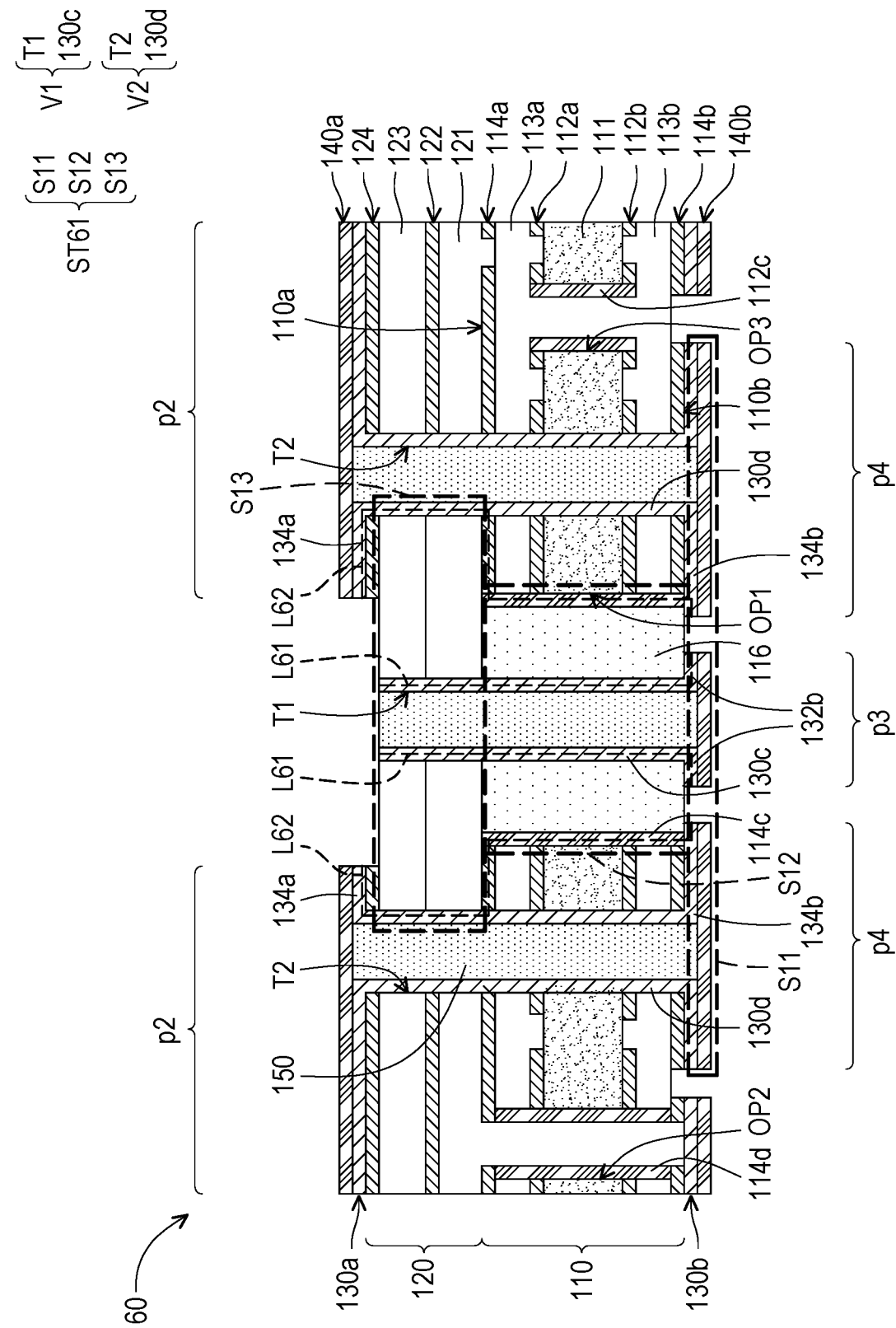
FIG. 11 is a schematic cross-sectional view of a circuit board structure according to another embodiment of the present disclosure.
Figure 12:
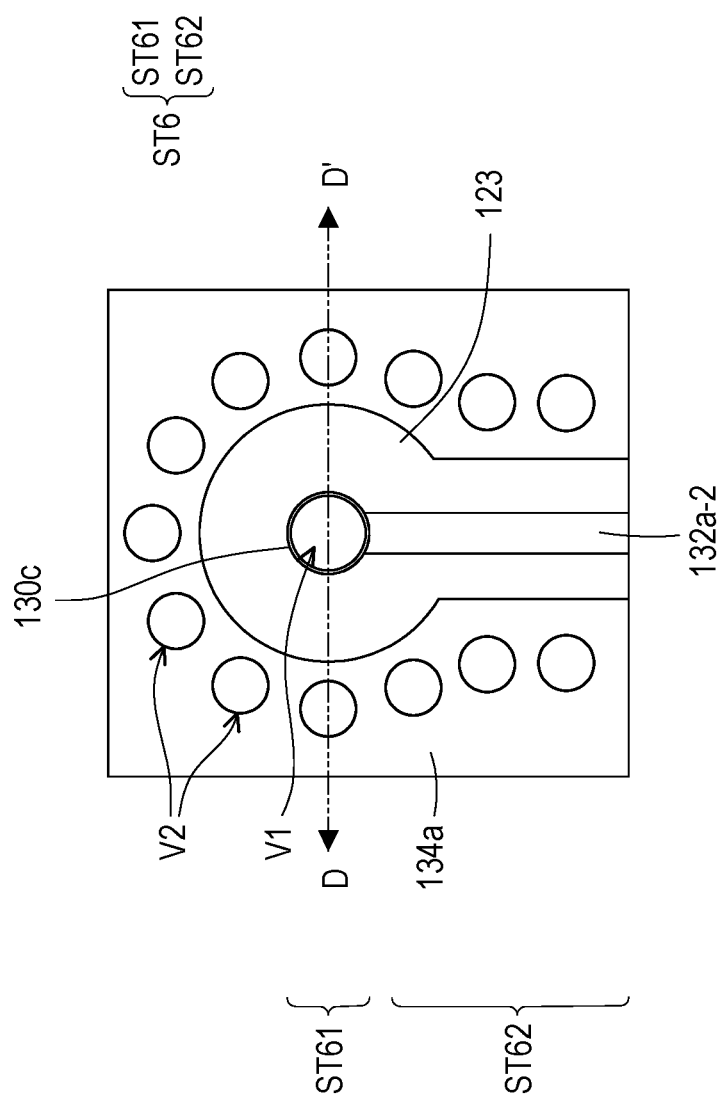
FIG. 12 is a schematic top view of a circuit board structure according to an embodiment of the present disclosure.
Figure 13:
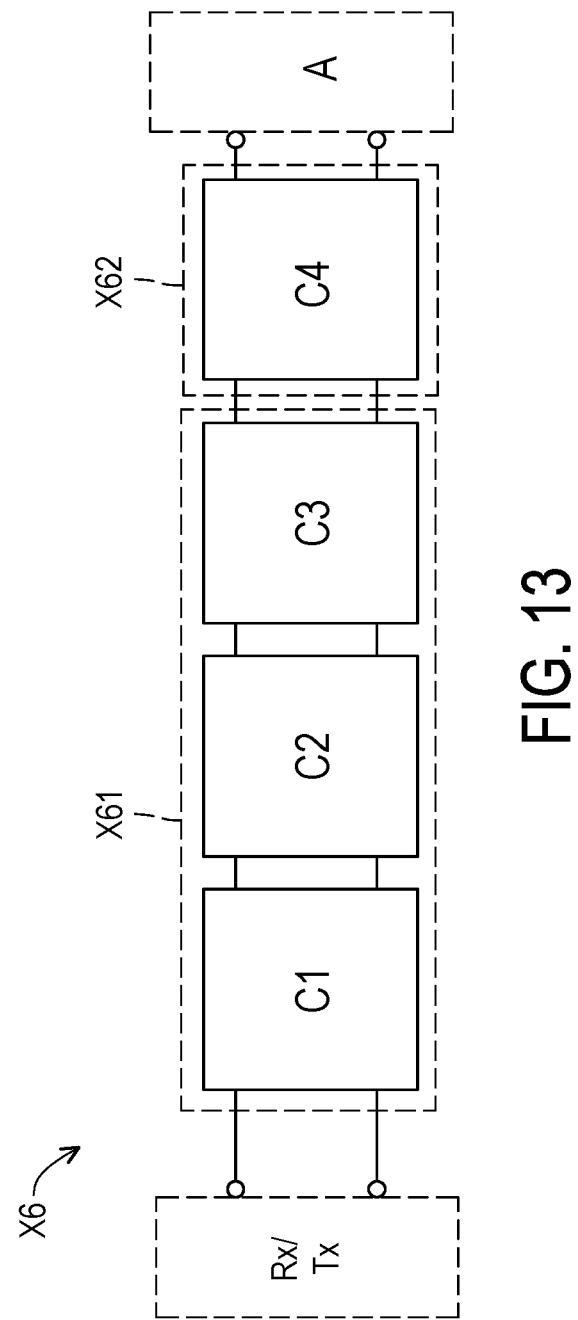
FIG. 13 is a schematic diagram of an equivalent circuit of a signal transmitting structure according to another embodiment of the present disclosure.

FIG. 11 is a schematic cross-sectional view of a circuit board structure according to another embodiment of the present disclosure. FIG. 12 is a schematic top view of a circuit board structure according to an embodiment of the present disclosure. FIG. 13 is a schematic diagram of an equivalent circuit of a signal transmitting structure according to another embodiment of the present disclosure. Herein, it is noted that the embodiments in FIGS. 11 and 12 continue using reference numbers and a part of the description of the embodiments in FIGS. 1 and 4A, wherein the same or similar reference numbers denote the same or similar elements, and the description of the same technical content is omitted. For the description of the omitted content, reference may be made to the foregoing embodiments, and details are not repeated herein. FIG. 11 may be a schematic cross-sectional view along the line D-D' in FIG. 12. FIG. 13 may be a schematic diagram of an equivalent circuit of the signal transmitting structure ST6 in FIG. 11.

Referring to FIGS. 11 and 12, the main difference between the circuit board structure 60 and the circuit board structure 10 lies in that, the circuit board structure 60 does not include a first top pad, so as to expose the surface of the filling structure 150 and a part of the conductive layer 130c. That is to say, the first top wiring layer 132a only includes a first top wiring portion 132a-2, and the first top wiring portion 132a-2 extends from the end of the first conductive via V1 and is electrically connected to the first conductive via V1. That is to say, the first top wiring portion 132a-2 extends from the exposed part of the conductive layer 130c and is electrically connected to the conductive layer 130c.

A first bottom wiring layer 132b, a first conductive via V1, a first top wiring layer 132a, a second bottom wiring layer 134b, a part of the second conductive vias V2, a loop-wrapping ground layer 114c, a second top wiring layer 134a, an insulating structure 116, and a part of the first build-up structure 120 located between the first conductive via V1 and the second conductive vias V2 define a signal transmitting structure ST6. The signal transmitting structure ST6 includes a signal transmitting via ST61 and a signal transmitting line ST62. The signal transmitting via ST61 is composed of a first transmitting section S11, a second transmitting section S12 and a third transmitting section S13. The signal transmitting line ST62 is constituted by the first top wiring portion 132a-2. The equivalent circuit X6 of the signal transmitting structure ST6 includes a first equivalent circuit C1, a second equivalent circuit C2, a third equivalent circuit C3, and a fourth equivalent circuit C4 connected in sequence. The first equivalent circuit C1 corresponds to the first bottom wiring layer 132b and the second bottom wiring layer 134b corresponding to the first bottom wiring layer 132b, which may correspond to, for example, a part of the first transmitting section S11 as shown in FIG. 11 The second equivalent circuit C2 corresponds to the loop-wrapping ground layer 114c, the insulating structure 116, and a part of the first conductive via V1 corresponding to the loop-wrapping ground layer 114c, which may correspond to, for example, a part of the second transmitting section S12 as shown in FIG. 11. The third equivalent circuit C3 corresponds to a part of the first build-up structure 120 located between the first conductive via V1 and the second conductive vias V2, and a part of the first conductive via V1 and a part of the second conductive vias V2 located in the first build-up structure 120, which may correspond to, for example, the third transmitting section S13 shown in FIG. 11. The fourth equivalent circuit C4 corresponds to the first top wiring portion 132a-2 and a part of the second top wiring layer 134a surrounding the first top wiring portion 132a-2, as shown in FIG. 12. The equivalent circuit X61 of the signal transmitting via ST61 is composed of a first equivalent circuit C1, a second equivalent circuit C2 and a third equivalent circuit C3 connected in sequence according to the ABCD transmission matrix connection principle. The equivalent circuit X62 of the signal transmitting line ST62 includes a fourth equivalent circuit C4. In other embodiments, the first top wiring portion 132a-2 can be formed by connecting multiple line segments with different line widths (similar to the first top wiring portion 132a-2 in FIG. 4C), so as to adjust resistance, inductance, conductance and capacitance parameters of the fourth equivalent circuit C4 to meet the needs of impedance matching.

The first bottom wiring layer 132b, the first conductive via V1 and the first top wiring layer 132a define a signal transmitting path L61, the second bottom wiring layer 134b, the loop-wrapping ground layer 114c, the second conductive vias V2 and the second top wiring layer 134a define a ground path L62, and the ground path L62 surrounds the signal transmitting path L61. In this way, the signal transmitting path L61 is surrounded by the ground path L62 in a closed manner. The high-frequency high-speed signals can be transmitted through the signal transmitting path L61, and the return signals are generated through the ground path L62, so as to form a good high-frequency high-speed loop.

In summary, the circuit board structure of the present disclosure has a signal transmitting structure. The equivalent circuit of the signal transmitting structure at least includes a first equivalent circuit, a second equivalent circuit, a third equivalent circuit and a fourth equivalent circuit, which respectively correspond to different uniform transmitting sections, and the signal transmitting path of each uniform transmitting section is surrounded by the ground path and enclosed in a closed manner. Such configuration can reduce energy loss and noise interference, thereby forming a good high-frequency and high-speed signal transmitting loop, and improving signal integrity and reliability.

Although the present disclosure has been disclosed above with the embodiments, it is not intended to limit the present disclosure. Anyone with ordinary knowledge in the technical field may make some changes and modifications without departing from the spirit and scope of the present disclosure. The scope of protection of the present disclosure should be defined by the scope of the appended patent application.

What is claimed is:
1. A circuit board structure, comprising:
a substrate, having a first surface and a second surface opposite the first surface, wherein the substrate comprises an opening penetrating through the substrate;
a loop-wrapping ground layer, disposed on an inner sidewall of the opening of the substrate;
an insulating structure, disposed in the opening of the substrate;
a first build-up structure, disposed on the first surface of the substrate;
a top wiring layer, disposed on the first build-up structure, wherein the top wiring layer comprises a first top wiring layer and a second top wiring layer;
a bottom wiring layer disposed on the second surface of the substrate, wherein the bottom wiring layer comprises a first bottom wiring layer and a second bottom wiring layer;
a first conductive via, penetrating through the first build-up structure and the insulating structure, and electrically connected to the first top wiring layer and the first bottom wiring layer, wherein the insulating structure is located between the loop-wrapping ground layer and the first conductive via; and
a plurality of second conductive vias, penetrating through the substrate and the first build-up structure, surrounding the first conductive via, and electrically connected to the second top wiring layer and the second bottom wiring layer, wherein the loop-wrapping ground layer is located between the first conductive via and the second conductive vias, and is electrically connected to the second conductive vias, wherein the first bottom wiring layer, the first conductive via, the first top wiring layer, the second bottom wiring layer, the loop-wrapping ground layer, a part of the second conductive vias, the second top wiring layer, the insulating structure, and a part of the first build-up structure located between the first conductive via and the second conductive vias define a signal transmitting structure, and an equivalent circuit of the signal transmitting structure at least comprises:
a first equivalent circuit, corresponding to the first bottom wiring layer and the second bottom wiring layer corresponding to the first bottom wiring layer;
a second equivalent circuit, corresponding to the loop-wrapping ground layer, the insulating structure, and a part of the first conductive via corresponding to the loop-wrapping ground layer;
a third equivalent circuit, corresponding to a part of the first build-up structure located between the first conductive via and the second conductive vias, and a part of the first conductive via and a part of the second conductive vias located in the first build-up structure; and
a fourth equivalent circuit, corresponding to the first top wiring layer and the second top wiring layer corresponding to the first top wiring layer;
wherein the first equivalent circuit, the second equivalent circuit, the third equivalent circuit and the fourth equivalent circuit respectively correspond to different uniform transmitting sections, and the first equivalent circuit, the second equivalent circuit, the third equivalent circuit and the fourth equivalent circuit are connected in series according to an ABCD transmission matrix series connection principle.

2. The circuit board structure of claim 1, wherein an end of the equivalent circuit of the signal transmitting structure is connected to a receiver or a transmitter, and another end of the equivalent circuit of the signal transmitting structure is connected to an antenna.

3. The circuit board structure of claim 1, wherein a unit length parameter of the first equivalent circuit, a unit length parameter of the second equivalent circuit, a unit length parameter of the third equivalent circuit, and a unit length parameter of the fourth equivalent circuit are different from each other.

4. The circuit board structure of claim 3, wherein the unit length parameter comprises resistance, conductance, inductance or capacitance.

5. The circuit board structure of claim 1, wherein the first bottom wiring layer, the first conductive via and the first top wiring layer define a signal transmitting path, the second top wiring layer, the second conductive vias, the loop-wrapping ground layer and the second bottom wiring layer define a ground path, and the ground path surrounds the signal transmitting path.

6. The circuit board structure of claim 1, further comprising:
a filling structure, disposed in the first conductive via and the second conductive vias.

7. The circuit board structure of claim 2, wherein the equivalent circuit of the signal transmitting structure further comprises:
a fifth equivalent circuit, connected between the fourth equivalent circuit and the antenna.

8. The circuit board structure of claim 7, wherein the fifth equivalent circuit is composed of a plurality of uniform transmitting sections, and equivalent circuits of the uniform transmitting sections are connected in series according to the ABCD transmission matrix series connection principle, so as to match an impedance.

9. The circuit board structure of claim 8, wherein the first top wiring layer comprises:
a first top pad portion, disposed at an end of the first conductive via and electrically connected to the first conductive via; and
a first top wiring portion, extending from the first top pad portion and electrically connected to the first top pad portion, wherein the fourth equivalent circuit corresponds to the first top pad portion, and the fifth equivalent circuit corresponds to the first top wiring portion.

10. The circuit board structure of claim 1, wherein the equivalent circuit of the signal transmitting structure further comprises:
a sixth equivalent circuit, connected between the third equivalent circuit and the fourth equivalent circuit or between the first equivalent circuit and the second equivalent circuit, wherein the sixth equivalent circuit corresponds to a structure of a uniform transmitting section.

11. The circuit board structure of claim 10, wherein the first build-up structure comprises:
a first dielectric layer, disposed on the first surface of the substrate;
a first wiring layer, disposed on the first dielectric layer;
a second dielectric layer, disposed on the first wiring layer; and
a second wiring layer, disposed on the second dielectric layer, wherein the top wiring layer is disposed on the second wiring layer,
wherein the third equivalent circuit corresponds to the first dielectric layer located between the first conductive via and the second conductive vias, and the sixth equivalent circuit corresponds to the second dielectric layer located between the first conductive via and the second conductive vias.

12. The circuit board structure of claim 11, wherein the equivalent circuit of the signal transmitting structure further comprises:
a seventh equivalent circuit, connected between the third equivalent circuit and the sixth equivalent circuit, wherein the seventh equivalent circuit corresponds to a part of the first wiring layer located between the first conductive via and the second conductive vias.

13. The circuit board structure of claim 12, wherein the first wiring layer comprises a first inner pad located between the first conductive via and the second conductive vias, wherein the first inner pad is electrically connected to the first conductive via.

14. The circuit board structure of claim 10, further comprising:
a second build-up structure, disposed on the second surface of the substrate, wherein the first conductive via and the second conductive vias further penetrate the second build-up structure,
wherein the sixth equivalent circuit corresponds to a part of the second build-up structure located between the first conductive via and the second conductive vias, and the first conductive via and a part of the second conductive vias located in the second build-up structure.

15. The circuit board structure of claim 14, wherein the second build-up structure comprises:
a third dielectric layer, disposed on the second surface of the substrate; and a third wiring layer, disposed on the third dielectric layer, wherein the bottom wiring layer is disposed on the third wiring layer.

16. The circuit board structure of claim 1, wherein the first top wiring layer comprises a first top wiring extending from an end of the first conductive via and electrically connected to the first conductive via, wherein the fourth equivalent circuit corresponds to the first top wiring.

17. The circuit board structure of claim 1, further comprising:
   a first covering layer, disposed on the top wiring layer; and
   a second covering layer, disposed on the bottom wiring layer.

* * * * *